US009003269B2

(12) United States Patent
Oshiyama et al.

(10) Patent No.: US 9,003,269 B2
(45) Date of Patent: Apr. 7, 2015

(54) MEMORY CONTROLLER AND SEMICONDUCTOR STORAGE DEVICE

(71) Applicant: Kabushiki Kaisha Toshiba, Minato-ku (JP)

(72) Inventors: Naoto Oshiyama, Tokyo (JP); Ryo Yamaki, Kanagawa (JP); Kenta Yasufuku, Kanagawa (JP); Naoaki Kokubun, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 102 days.

(21) Appl. No.: 13/837,950

(22) Filed: Mar. 15, 2013

(65) Prior Publication Data

US 2014/0068376 A1 Mar. 6, 2014

Related U.S. Application Data

(60) Provisional application No. 61/695,015, filed on Aug. 30, 2012.

(51) Int. Cl.
*H03M 13/00* (2006.01)
*G06F 11/10* (2006.01)
*H03M 13/29* (2006.01)
*H03M 13/15* (2006.01)

(52) U.S. Cl.
CPC ............ *G06F 11/10* (2013.01); *G06F 11/1048* (2013.01); *H03M 13/1515* (2013.01); *H03M 13/152* (2013.01); *H03M 13/1525* (2013.01); *H03M 13/154* (2013.01); *H03M 13/1545* (2013.01); *H03M 13/2906* (2013.01); *H03M 13/2927* (2013.01); *H03M 13/6502* (2013.01); *H03M 13/6561* (2013.01)

(58) Field of Classification Search
CPC ....................................................... G06F 11/10
USPC ................................ 714/763, 782, 784, 785
See application file for complete search history.

(56) References Cited

U.S. PATENT DOCUMENTS

| 6,031,875 | A | * | 2/2000 | Im .................................. 375/262 |
| 7,586,808 | B2 | * | 9/2009 | Kwon et al. ............. 365/230.03 |
| 7,739,576 | B2 | * | 6/2010 | Radke ........................... 714/758 |
| 8,301,986 | B2 | * | 10/2012 | Jo et al. ........................ 714/785 |
| 8,312,345 | B1 | * | 11/2012 | Feng ............................. 714/755 |
| 8,392,807 | B2 | * | 3/2013 | Naradasi et al. ............. 714/784 |
| 8,667,369 | B2 | * | 3/2014 | Kong et al. ................... 714/763 |

FOREIGN PATENT DOCUMENTS

| JP | 4-45015 B2 | 7/1992 |
| JP | 8-130480 A | 5/1996 |
| JP | 10-229343 A | 8/1998 |

* cited by examiner

*Primary Examiner* — Esaw Abraham
(74) *Attorney, Agent, or Firm* — Oblon, McClelland, Maier & Neustadt, L.L.P.

(57) ABSTRACT

According to one embodiment, a decoder of a memory controller includes: a syndrome calculating unit configured to calculate a syndrome based upon a code word read from the memory; an error locator polynomial generating unit configured to generate an error locator polynomial based upon the syndrome, and to obtain a number of errors based upon the generated error locator polynomial; and an error location calculating unit configured to calculate an error location based upon the error locator polynomial, wherein the process of the error location calculating unit is not executed, when the number of errors is not less than the maximum number of bits that can be corrected by the error locator polynomial generating unit.

14 Claims, 19 Drawing Sheets

FIG.19
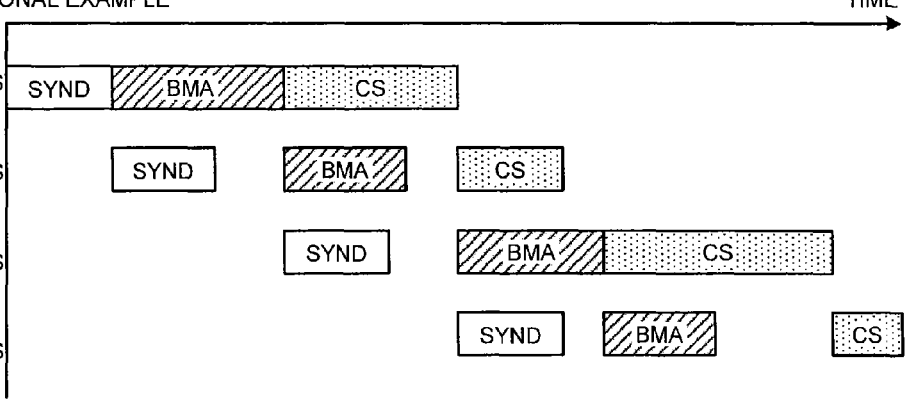
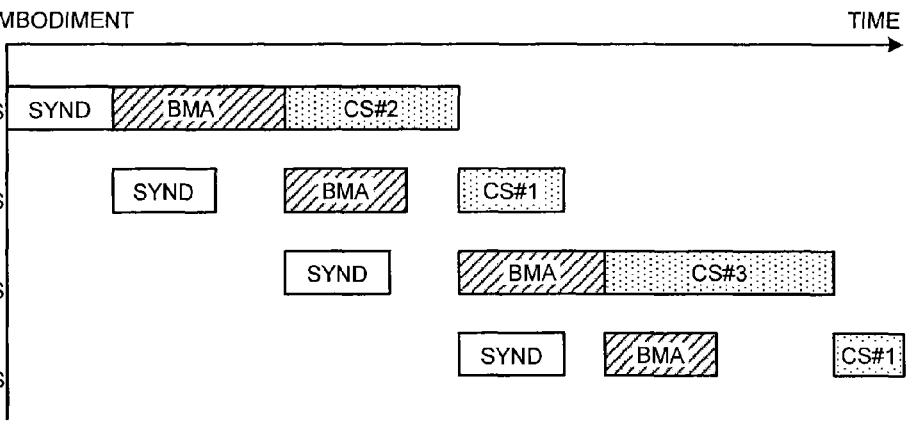
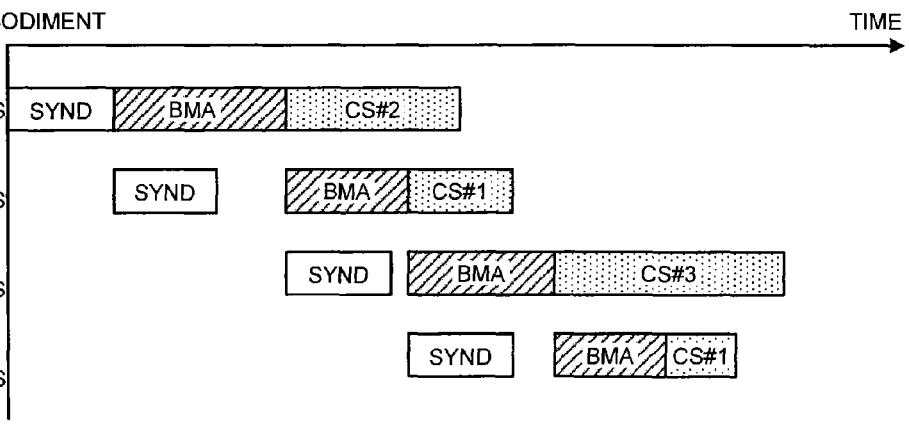

MEMORY CONTROLLER AND SEMICONDUCTOR STORAGE DEVICE

CROSS-REFERENCE TO RELATED APPLICATIONS

This application is based upon and claims the benefit of priority from Provisional Patent Application No. 61/695,015, filed on Aug. 30, 2012; the entire contents of which are incorporated herein by reference.

FIELD

Embodiments described herein relate generally to a memory controller and a semiconductor storage device.

BACKGROUND

An error correction circuit is a circuit used in various fields such as for communication devices or storage techniques. Among the error correction circuits, an error correction circuit that uses BCH code with M-bit (M is an integer of 2 or more) error correction capability can surely correct errors of M bits or lower bit. The error correction circuit using BCH code makes an error correction by successively operating three types of circuits, which are a syndrome calculation circuit, an error locator polynomial deriving circuit, and an error location calculating circuit (Chien search circuit). Each process can independently be executed, and when plural error correction processing frames, each including data and redundant part for an error correction, are processed, they can be processed in a pipeline manner.

The error correction circuit using BCH code confirms that a number of error bits (number of errors) that is an output from the error locator polynomial deriving circuit and a number of error bits detected by the error location calculating circuit agree with each other or not, thereby determines whether the error correction is correctly done or not. After the determination as to whether the error correction is correctly done or not, the next error correction process is started.

When the number of error bits (number of errors) that is the output from the error locator polynomial deriving circuit and the number of error bits detected by the error location calculating circuit do not match in the determination as to whether the error correction is correctly done or not, the error correction is not executed, and it is determined that the error correction is impossible. In this case, although it results in the error correction not correctly executed, the process of the error location calculating circuit is always executed, which leads to consume power of the error location calculating circuit. In addition, although it results in the error correction not correctly executed, the process of the error location calculating circuit is always executed, which prevents processing speed from increasing.

BRIEF DESCRIPTION OF THE DRAWINGS

FIG. 19 is a view illustrating an example of an operation in a semiconductor storage device according to a fifth embodiment.

DETAILED DESCRIPTION

In general, according to one embodiment, a memory controller that controls a memory is provided, the memory controller including: an encoder that executes an error correction coding process based upon user data stored in the memory to generate a code word; and a decoder that executes an error correction process based upon the code word read from the memory. The decoder includes: a syndrome calculating unit that calculates a syndrome based upon the code word read from the memory; an error locator polynomial generating unit that generates an error locator polynomial based upon the syndrome to obtain a number of errors based upon the generated error locator polynomial; an error location calculating unit that calculates an error location based upon the error locator polynomial; and a decoding control unit that determines that the error correction is impossible, and not to allow the execution of the process of the error location calculating unit, when the number of errors is not less than the maximum number of bits that can be corrected by the error locator polynomial generating unit.

A memory controller and a semiconductor storage device according to the embodiments will be described in detail below with reference to the attached drawings. The present invention is not limited by these embodiments.

First Embodiment

Figure 1:
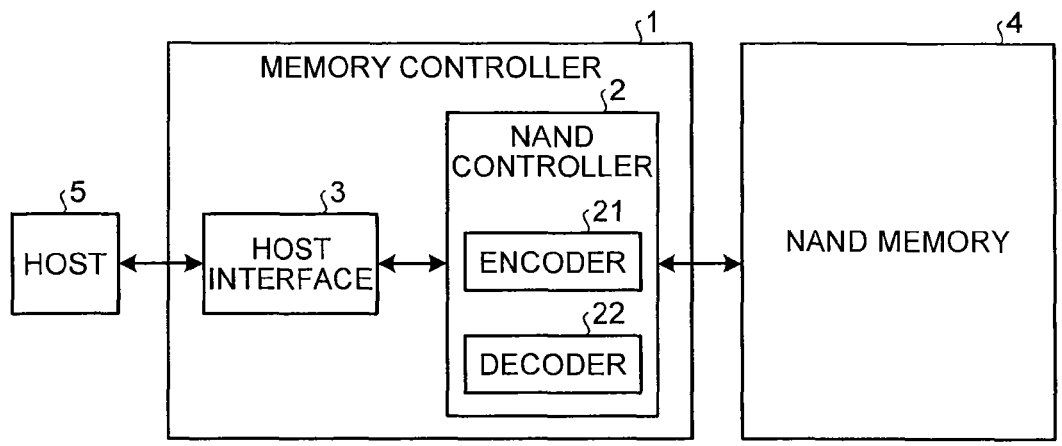
FIG. 1 is a diagram illustrating an example of a configuration of a semiconductor storage device according to a first embodiment.

FIG. 1 is a diagram illustrating one example of a configuration of a semiconductor storage device according to a first embodiment. As illustrated in FIG. 1, the semiconductor storage device according to the present embodiment includes a memory controller 1, and a NAND memory (memory) 4. The semiconductor storage device 1 can be connected to a host 5, and FIG. 1 illustrates state that the semiconductor storage device 1 connected to the host 5. The host 5 is an electronic device such as a personal computer, or a portable terminal, for example.

The memory controller 1 has a host interface 3 and a NAND controller 2. The host interface 3 is connected to the host 5 to receive writing data, written to the NAND memory 4, from the host 5, and to transmit the data read from the NAND memory 4 to the host 5 based upon a request from the host 5. The NAND controller 2 is connected to the NAND memory 4 to control writing and reading to and from the NAND memory 4. As described above, the data transfer is executed with the memory controller 1 serving as a mediation device between the host 5 and the NAND memory 4. Since the memory controller 1 serves as the mediation device, the difference in generations of the NAND memory 4 can be concealed to the host 5.

A NAND controller 2 includes an encoder 21 that executes the error correction coding process to the writing data written to the NAND memory 4 to generate a parity, and a decoder 22 that executes a decoding process to a code word (data and parity) read from the NAND memory 4 to perform an error correction. A case where a BCH coding process is executed as the error correction coding process will be described below. However, the error correction coding process is not limited to the BCH coding process, but may be an RS (Reed-Solomon) coding process. In the example of the configuration of the memory controller 1 illustrated in FIG. 1, the encoder 21 and the decoder 22 are provided in the NAND controller 2. However, the encoder 21 and the decoder 22 may be provided separate from the NAND controller 2.

When data is written to the NAND memory 4, the encoder 21 executes the BCH coding process to the data to be written to generate the parity. The NAND controller 2 writes the writing data and the parity to the NAND memory 4. In the present embodiment, the encoder 21 is assumed to generate a code word that can correct T (T is an integer of 2 or more) bits.

When the data is read from the NAND memory 4, the NAND controller 2 reads the data and the parity corresponding to the data from the NAND memory 4, and the decoder 22 executes the BCH decoding process based upon the data and the parity to correct a data error.

Figure 2:
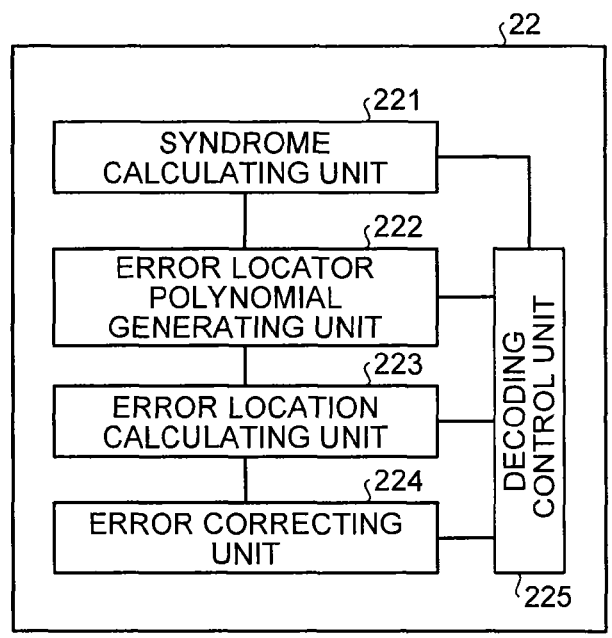
FIG. 2 is a diagram illustrating an example of a configuration of a decoder according to the first embodiment.

FIG. 2 is a diagram illustrating an example of the configuration of the decoder 22 according to the present embodiment. As illustrated in FIG. 2, the decoder 22 includes a syndrome calculating unit 221, an error locator polynomial generating unit 222, an error location calculating unit 223, an error correcting unit 224, and a decoding control unit 225.

The syndrome calculating unit 221 and the error locator polynomial generating unit 222 in the present embodiment have a capability of correcting M bits. M may only be a number not less than T that is the maximum number of bits that can be corrected by the code word. The error location calculating unit 223 in the present embodiment has a capability of correcting N bits. N is an integer of M or less.

The syndrome calculating unit 221 executes a syndrome calculation based upon the code word read from the NAND memory 4. The error locator polynomial generating unit 222 generates an error locator polynomial with BMA (Berlekamp-Massey algorithm) by using the calculated syndrome, generates a number of error bits (number of errors) based upon the generated error locator polynomial, and outputs these results to the decoding control unit 225. The error location calculating unit 223 calculates an error location by using a coefficient of the generated error locator polynomial to specify an error location, and outputs the specified number of errors (number of error bits) to the decoding control unit 225. The decoding control unit 225 determines whether the error correction is possible or not, and notifies the error correcting unit 224 of the determination result. When the error correction is possible as the determination result, the error correcting unit 224 inverses the bit corresponding to the error location specified by the error location calculating unit 223, thereby executes the error correction.

Figure 3:
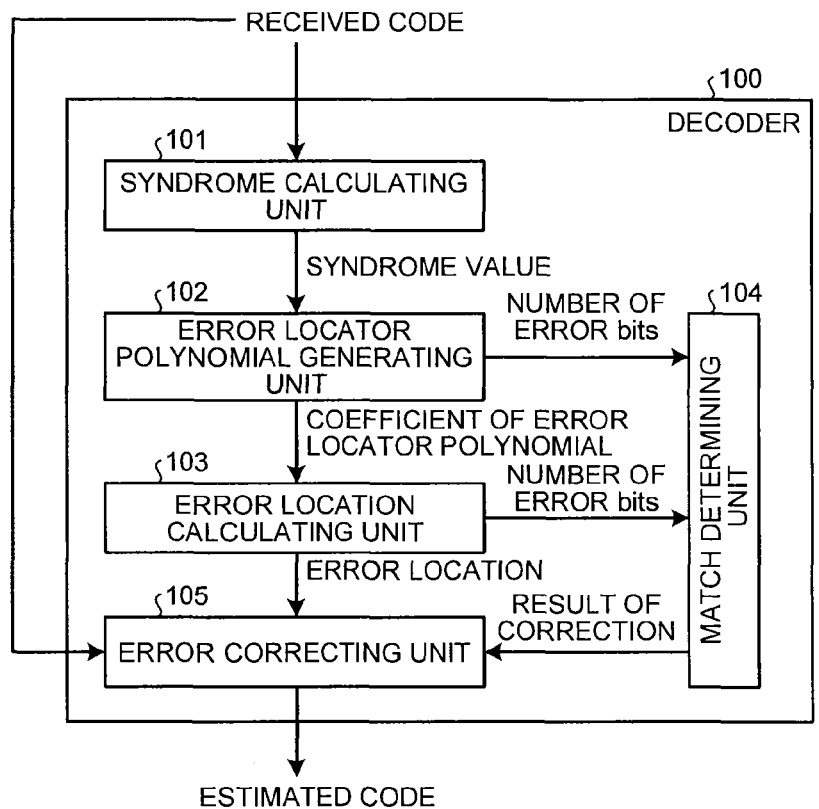
FIG. 3 is a diagram illustrating an example of a configuration of a conventional decoder.

A conventional general decoder will be described below. FIG. 3 is a diagram illustrating an example of a configuration of a conventional decoder 100. The decoder 100 includes a syndrome calculating unit 101, an error locator polynomial generating unit 102, an error location calculating unit 103, a match determining unit 104, and an error correcting unit 105. When the conventional decoder 100 can correct M bits, the syndrome calculating unit 101, the error locator polynomial generating unit 102, and the error location calculating unit 103 have a capability of correcting M bits.

Figure 4:
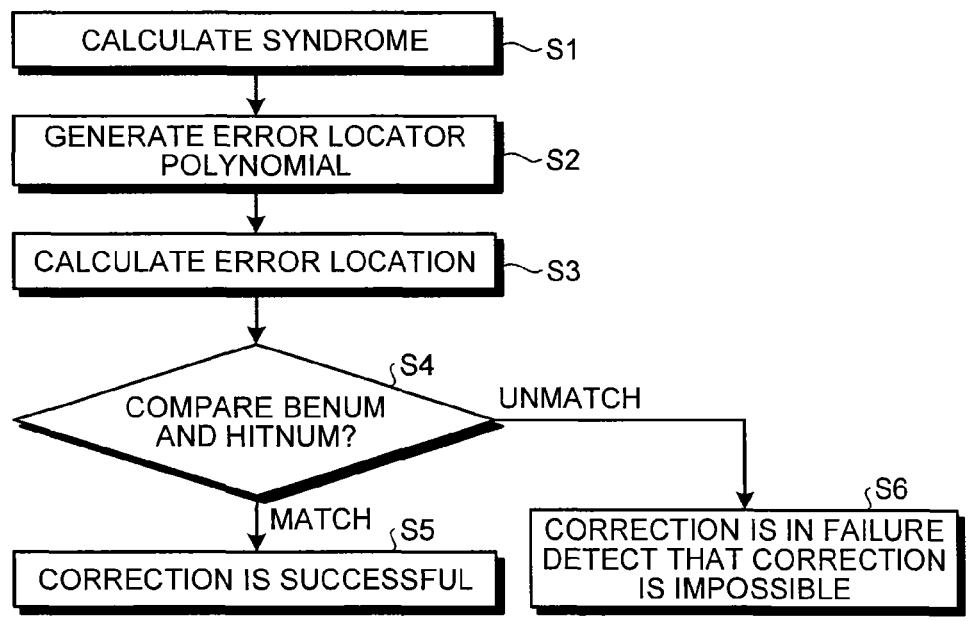
FIG. 4 is a flowchart illustrating one example of an error correction process by the conventional decoder.

FIG. 4 is a flowchart illustrating one example of an error correction process by the conventional decoder 100. Firstly, the syndrome calculating unit 101 calculates a syndrome based upon a received code (the code word read from the NAND memory 4 in the present embodiment) (step S1). The error locator polynomial generating unit 102 generates an error locator polynomial by using the calculated syndrome, obtains a number of error bits, and outputs the results to the match determining unit 104 (step S2). The error location calculating unit 103 calculates an error location by using a coefficient of the generated error locator polynomial to specify the error location, and outputs the specified number of errors (number of error bits) to the match determining unit 104 (step S3).

The match determining unit 104 compares the number of error bits (BENUM) outputted from the error locator polynomial generating unit 102 and the number of error bits (HITNUM) outputted from the error location calculating unit 103, and when they match (match in step S4), it determines that the error correction is successful, and notifies the error correcting unit 105 of the determination result (step S5). On the other hand, when the BENUM and the HITNUM do not match (unmatch in step S4), the match determining unit 104 determines that the error correction is impossible, and notifies a control unit (not illustrated) that controls the entire NAND controller 2 of the result indicating that the error correction is impossible (step S6).

When the error correction is possible as a result of the determination, the error correcting unit 105 executes the error correction by inverting the bit corresponding to the error location specified by the error location calculating unit 103.

Figure 5:
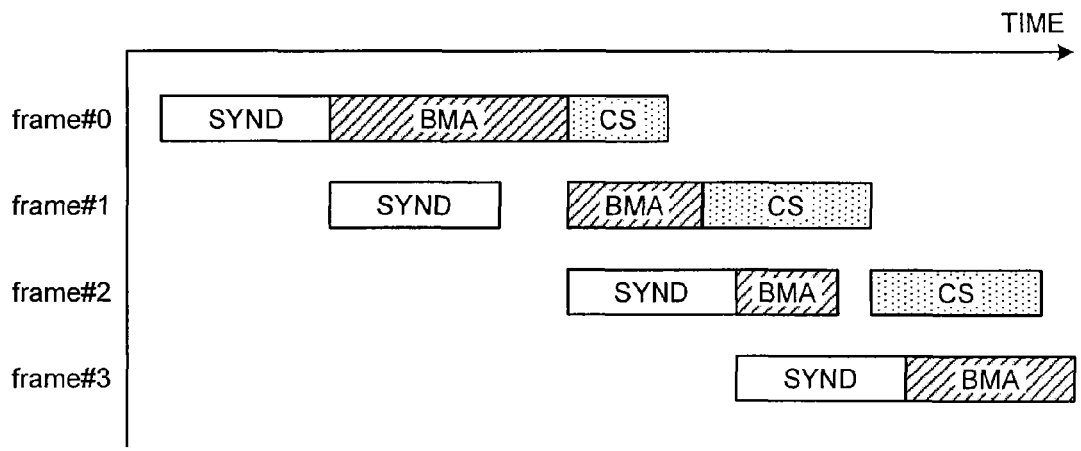
FIG. 5 is a view illustrating an example of an operation when each block is operated in a pipeline manner in the conventional decoder.

FIG. 5 is a view illustrating an example of the operation of the conventional decoder 100, when each block is operated in a pipeline manner (according to a pipeline process system). In FIG. 5, the process of the syndrome calculating unit 101 is abbreviated to SYND, the process of the error location polynomial generating unit 102 is abbreviated to BMA, and the process of the error location calculating unit 103 is abbreviated to CS. It is supposed here that the process of the error correction process is executed in a unit of frame. The processing time of the syndrome calculating process (SYND) is almost fixed, regardless of the frame. The processing time of the error location polynomial generating process (BMA) becomes longer according to the number of errors, and the processing time of the error location calculating process (CS) also becomes longer according to the number of errors.

In the example of the operation illustrated in FIG. 5, the match determining unit 104 compares the number of error bits outputted from the error locator polynomial generating unit 102 and the number of error bits outputted from the error location calculating unit 103, and determines whether the error correction is possible or not based upon the comparison result. Thereafter, the error location calculating process (Chien search process) for the next frame is executed. Therefore, the error location calculating process is executed even to the frame whose error correction is determined to be impossible. Accordingly, the error location calculating unit 103 cannot execute the process for the next frame, until the error correction is determined to be impossible as a result of the error location calculating process for the frame, to which the error correction is determined to be impossible, and this can prevent the processing speed from increasing. The power consumption of the error location calculating unit 103 occupies most of the total power consumption of the decoder 100, and it is desirable from the viewpoint of the power consumption that the error location calculating unit 103 is operated as little as possible.

On the other hand, when the received code that is to be inputted includes errors more than M bits in a case where the error locator polynomial generating process by which M bits can be corrected (the maximum correcting capability is M bits) is executed, the number of error bits calculated by the error locator polynomial generating process is M bits in most cases. The present embodiment utilizes this situation, and when the number of error bits calculated by the error locator polynomial generating process is M bits, the error location calculating process is not executed to realize an increase in the processing speed and reduction in power consumption.

There may be a case in which the number of error bits calculated by the error locator polynomial generating process becomes smaller than M bits when the received code that is to be inputted includes errors more than M bits. In this case, the error location calculating process is executed in the present embodiment, and as in the conventional case, it is determined that the error correction is impossible when the BENUM and the HITNUM do not match. The possibility that the number of error bits calculated by the error locator polynomial generating process becomes smaller than M bits is very low, so that the increase in the processing speed and the reduction in power consumption can be realized as a whole, even if the error location calculating process is executed in this case.

There may be the case in which the number of error bits calculated by the error locator polynomial generating process becomes greater than M bits when the received code that is to be inputted includes errors more than M bits. In this case, the increase in the processing speed and the reduction in power consumption can be realized only by setting that the error location calculating process is not executed when the number of error bits calculated by the error locator polynomial generating process becomes M bits or more.

Figure 6:
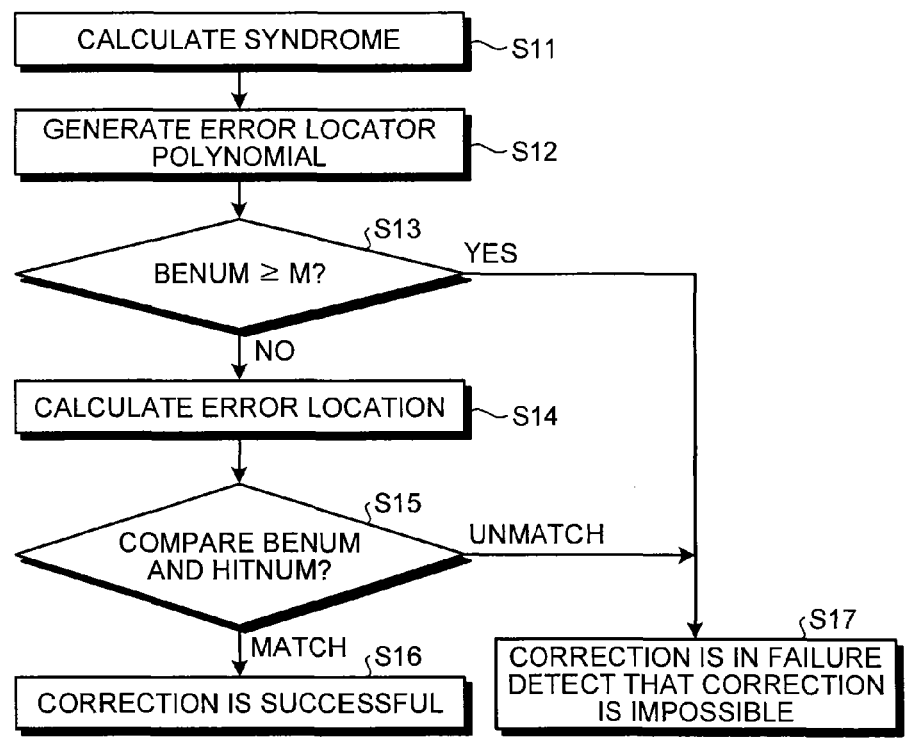
FIG. 6 is a flowchart illustrating one example of the error correction process according to the first embodiment.

The operation of the present embodiment will be described below. FIG. 6 is a flowchart illustrating one example of the error correction process according to the present embodiment. Firstly, the syndrome calculating unit 221 calculates a syndrome based upon a code word read from the NAND memory 4 in the present embodiment (step S11). The error locator polynomial generating unit 222 generates an error locator polynomial by using the calculated syndrome, obtains a number of error bits (BENUM), and outputs the results to the decoding control unit 225 (step S12).

The decoding control unit 225 determines whether or not the BENUM is M or more (step S13). When the BENUM is less than M (No in step S13), the decoding control unit 225 instructs the error location calculating unit 223 to start the process. The error location calculating unit 223 executes an error location calculating process (Chien search process) by using a coefficient of the error locator polynomial to specify the error location, and outputs the number of the specified errors (number of error bits HITNUM) to the decoding control unit 225 (step S14).

The decoding control unit 225 compares the BENUM and the HITNUM (step S15), and when they match (match in step S15), it determines that the error correction is successful, and notifies the error correcting unit 224 of the determination result (step S16). On the other hand, when the BENUM and the HITNUM do not match (unmatch in step S15), the decoding control unit 225 determines that the error correction is in failure, and notifies a control unit (not illustrated) that controls the entire NAND controller 2 of the result indicating that the error correction is impossible (step S17).

On the other hand, when it is determined that the BENUM is M or more in step S13 (Yes in step S13), the decoding control unit 225 proceeds to step S17 without operating the error location calculating unit 223 and the error correcting unit 224.

As described with reference to FIG. 6, in a case of BENUM=M, the error location calculating process is not executed. Accordingly, the number of bits N that can be corrected by the error location calculating unit 223 may be set as N=M−1. By setting N=M−1, the circuit scale of the error location calculating unit 224 can be reduced.

Figure 7:
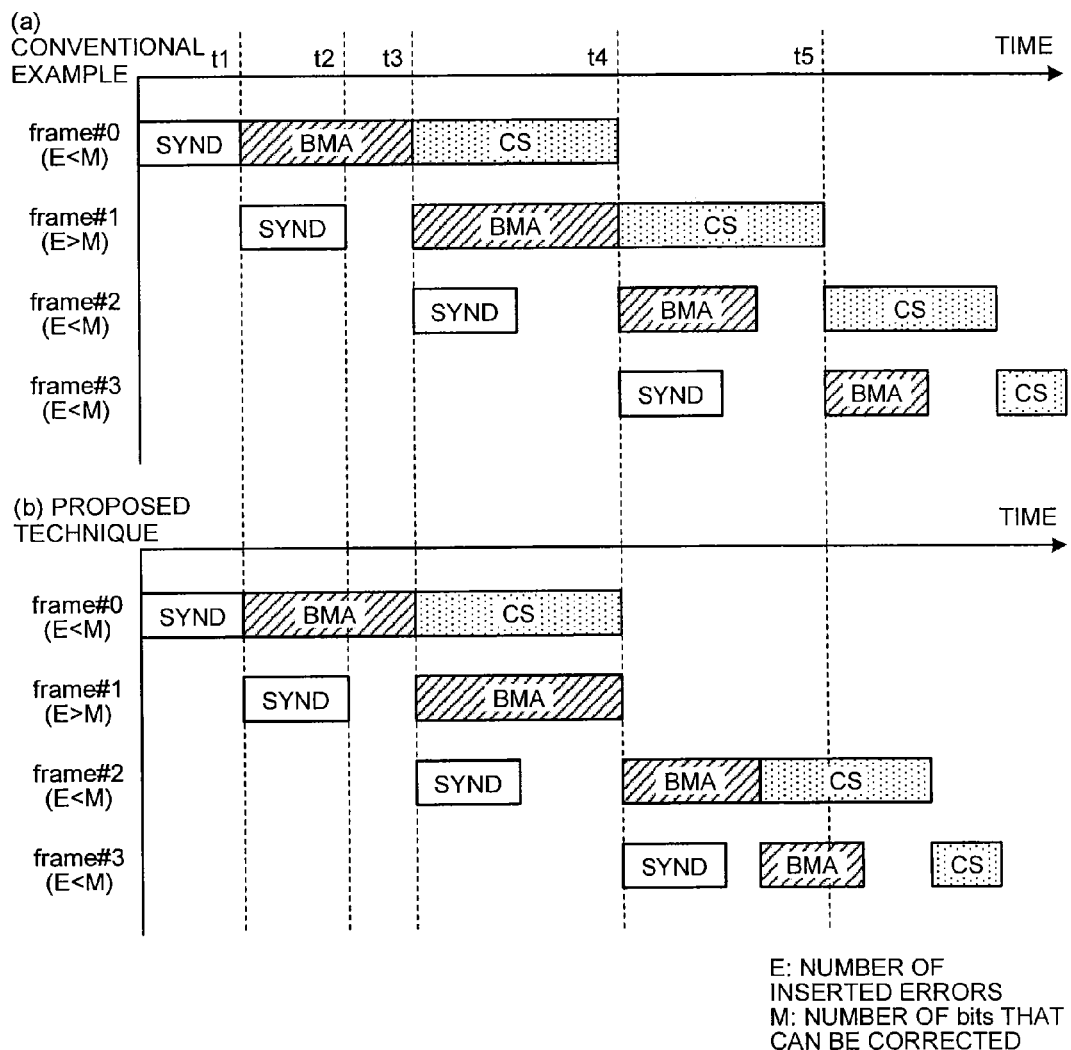
FIG. 7 is a view illustrating an example of an operation when each block is operated in a pipeline manner in the decoder according to the embodiment of the present invention.

FIG. 7 is a view illustrating an example of an operation when the decoder 22 according to the present embodiment is operated in a pipeline manner. For comparison, FIG. 7A that is an upper chart illustrates the example of the conventional operation, and FIG. 7B that is a lower chart illustrates the example of the operation according to the present embodiment. In FIG. 7, the number of errors included in the received code (the code word read from the NAND memory 4) is defined as E, and which is larger, E or M inputted for each frame, is described in parenthesis. In FIG. 7, E<M in frames #0, #2, and #3, while E>M in frame #1.

In FIG. 7, the process of the syndrome calculating units 221 and 101 (syndrome calculating process) is abbreviated to SYND, the process of the error location polynomial generating units 222 and 102 (error locator polynomial generating process) is abbreviated to BMA, and the process of the error location calculating units 223 and 103 (Chien search process) is abbreviated to CS. In addition, t1 to t4 indicate a start time (time of starting the syndrome calculating process) of the error correction process for each of the frames #0 to #3, and t5 indicates an end time of the error location calculating process for the frame #1.

In the example of the conventional operation in FIG. 7A, the error location calculating process is executed even for the frame #1, and therefore, the error location calculating process for the frame #2 cannot be started until t5 when the error location calculating process for the frame #1 is ended. On the contrary, in the example of the operation according to the present embodiment in FIG. 7B, BENUM=M is established since E>M for the frame #1, so that the error location calculating process is not executed. Therefore, the error location calculating process for the frame #2 is started just after the error locator polynomial generating process is ended.

As described above, when the number of error bits calculated in the error locator polynomial generating process is M or more, the error location calculating process is not executed in the present embodiment. Accordingly, when data including errors more than the number of bits that can be corrected is inputted, the increase in the speed for the determination and the reduction in power consumption can be realized. The reading speed from the NAND memory 4 can be decreased by using the memory controller 1 utilizing this error correction circuit.

Second Embodiment

Figure 8:
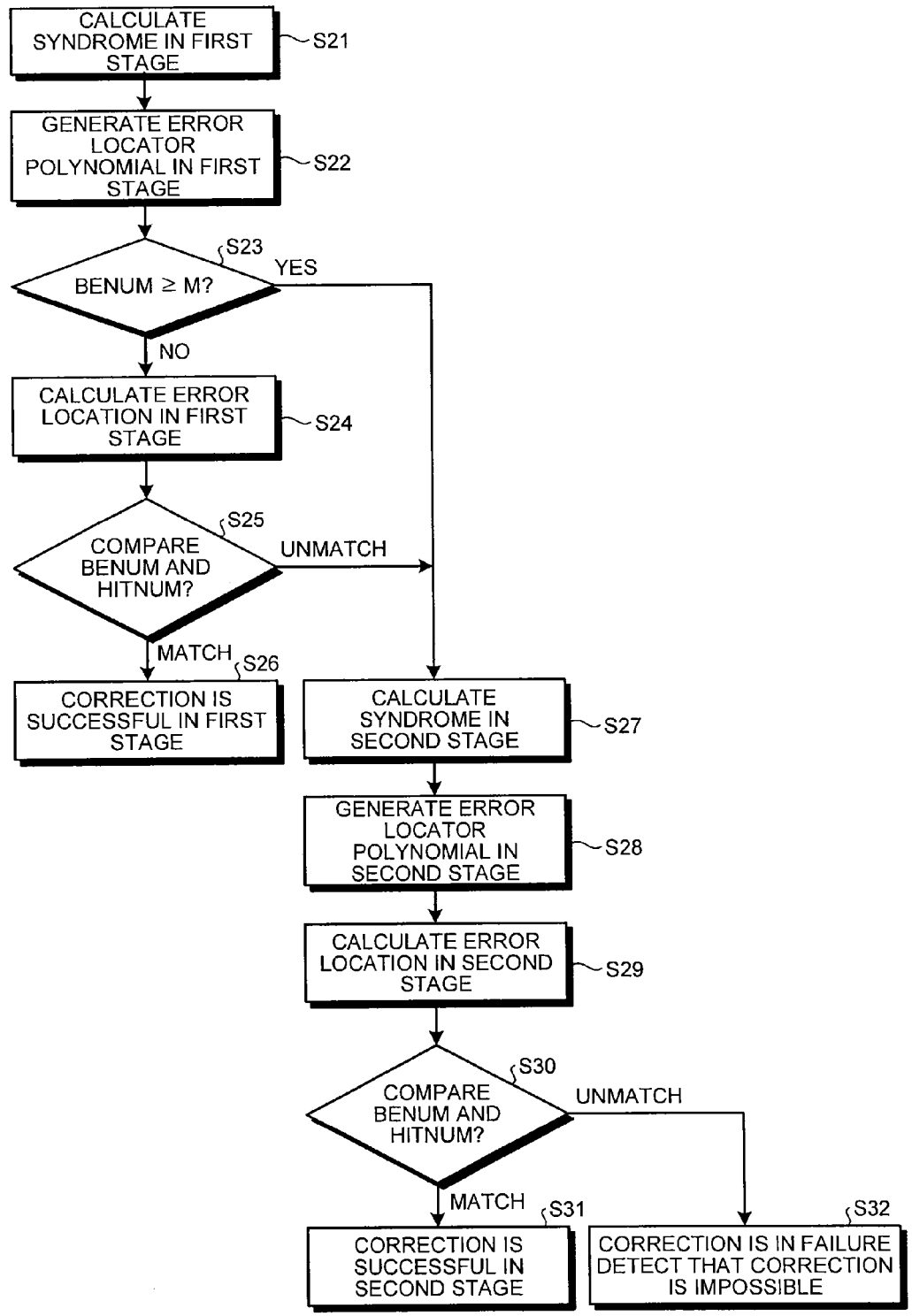
FIG. 8 is a flowchart illustrating one example of an error correction process in a semiconductor storage device according to a second embodiment.

FIG. 8 is a flowchart illustrating one example of an error correction process in a semiconductor storage device according to a second embodiment. The semiconductor storage device according to the present embodiment is the same as the semiconductor storage device according to the first embodiment. It is to be noted that the configurations of the encoder 21 and the decoder 22 are different from those in the first embodiment.

In the present embodiment, a multi-step error correction process for performing the error correction coding process in two or more steps is executed. The encoder 21 generates a parity in each step by the multi-step error correction process. The error correction coding process in the first step (first stage) is assumed to be the BCH coding process. However, the error correction coding process in the first stage may be an RS coding process. The error coding process in the second (second stage) and the subsequent steps is the same as that in the conventional case, and any error correction coding process may be used. The error correction coding process in the second and subsequent stages may be the same as the error correction coding process in the first stage, or may be different.

Figure 9A:
FIGS. 9A and 9B are views for describing an example of a multi-step error correction process according to the second embodiment.
Figure 9B:
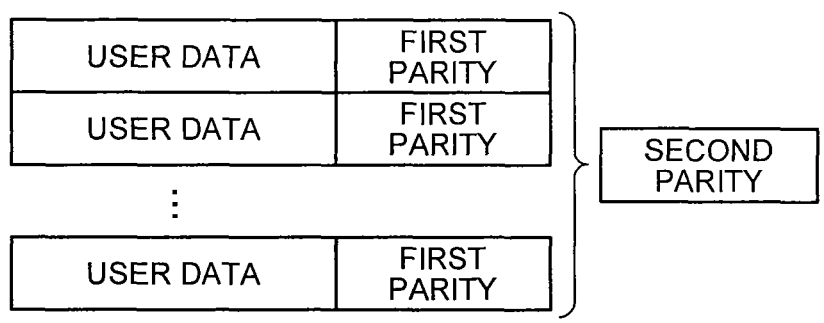

In the description below, it is assumed that the error correction coding process is executed in two steps that are the first stage and the second stage, for example. FIGS. 9A and 9B are views for describing the example of the multi-step error correction process according to the present embodiment. FIG. 9A illustrates an example in which a first parity is generated for user data by the error correction coding process in the first stage, and a second parity is generated for the user data (or user data and first parity) by the error correction coding process in the second stage. FIG. 9B illustrates an example in which the first parity is generated for the user data by the error correction coding process in the first stage, and the second parity is generated for a plurality of user data (or user data and the first parity) in the second stage. The relationship between the user data and each step in the multi-step error correction process to which the present embodiment is applied may be either one of the relationships illustrated in FIGS. 9A and 9B, or may be the relationship other than those illustrated in FIGS. 9A and 9B.

As described above, when the error correction coding process is executed in multiple stages, the error correction process is executed in multiple stages even during the decoding. In the error correction process in the first stage, the error correction process using the first parity and the user data is executed, and in the error correction process in the second stage, the error correction process using the second parity and the user data (or the first parity, the second parity, and the user data) is executed.

The decoder 22 in the present embodiment includes the error correction circuit illustrated in FIG. 2 as the configuration of executing the error correction process in the first stage, and an error correction circuit for executing the error correction process in the second stage. The error correction circuit for executing the error correction process in the second stage may be the same as the error correction circuit illustrated in FIG. 2, or may be different. Only one error correction circuit may be used to execute both the error correction process in the first stage and the error correction process in the second stage.

It is supposed that the number of bits that can be corrected in the error correction process in the first stage is M bits, and the number of bits that can be corrected in the error correction process in the second stage is L (L is an integer satisfying L>M) bits. Firstly, the error correction process in the first stage is executed, and when this error correction is successful, the error correction process is ended without executing the error correction process in the second stage. When the error correction process in the first stage is executed, and this error correction is in failure, the error correction process in the second stage is executed.

In the conventional error correction process, when the received code includes errors more than M bits, the error correction in the second stage is executed after it is determined that the error correction is in failure after the error location calculating process in the first stage. In the present embodiment, when the number of error bits calculated in the error locator polynomial generating process is M or more after the generation of the error locator polynomial in the first stage, the error correction in the second stage is executed without executing the error location calculating process. With this process, the increase in the processing speed and the reduction in the power consumption can be realized, compared to the conventional case.

The error correction process according to the present embodiment will be described. In FIG. 8, it is supposed that the error correction coding processes in the first stage and the second stage are both BCH coding process. The decoder 22 in the present embodiment includes the error correction circuit that has the same configuration as the error correction circuit in FIG. 2 for executing the error correction coding process in the second stage. All or a part (e.g., the decoding control unit 225) of the error correction circuit may be shared in the first stage and in the second stage.

As illustrated in FIG. 8, the syndrome calculating unit 221 firstly calculates a syndrome in the first stage based upon a code word read from the NAND memory 4 (step S21). The error locator polynomial generating unit 222 generates an error locator polynomial in the first stage by using the calculated syndrome, obtains a number of error bits (BENUM), and outputs the results to the decoding control unit 225 (step S22).

The decoding control unit 225 determines whether or not the BENUM is M or more (step S23). When the BENUM is less than M (No in step S23), the decoding control unit 225 instructs the error location calculating unit 223 to start the process. The error location calculating unit 223 executes an error location calculating process by using a coefficient of the error locator polynomial in the first stage to specify the error location, and outputs the number of the specified errors (number of error bits HITNUM) to the decoding control unit 225 (step S24).

The decoding control unit 225 compares the BENUM and the HITNUM in the first stage (step S25), and when they match (match in step S25), it determines that the error correction in the first stage is successful, and notifies the error correcting unit 224 of the determination result (step S26).

On the other hand, when the decoding control unit 225 determines that the BENUM is M or more (Yes in step S23), it determines to start the error correction process in the second stage, and the syndrome calculating unit 221 for the second stage executes the syndrome calculation (step S27). Then, the error locator polynomial generating unit 222 for the second stage generates an error locator polynomial in the second stage by using the calculated syndrome, obtains a number of error bits (BENUM), and outputs the results to the decoding control unit 225 (step S28).

The error location calculating unit 223 for the second stage calculates the error location by using the coefficient of the error locator polynomial for the second stage to specify the error location, and outputs the specified number of errors (number of error bits HITNUM) to the decoding control unit 225 for the second stage (step S29). The decoding control unit 225 for the second stage compares the BENUM and the HITNUM in the second stage (step S30), and when they match (match in step S30), it determines that the error correction in the second stage is successful, and notifies the error correcting unit 224 of the determination result (step S31).

On the other hand, when the BENUM and the HITNUM in the second stage do not match (unmatch in step S30), the decoding control unit 225 notifies the result indicating that the error correction in the second stage is impossible (step S32). When the BENUM and the HITNUM in the first stage do not match (unmatch in step S25), the decoding control unit 225 proceeds to step S27.

According to the operation described above, the error correction up to (M−1) bits can generally be executed in the first stage, and when the received code to which errors more than M bits are added is processed, the error correction in the second stage can be executed without executing the error location calculating process in the first stage. As in the first embodiment, it is unnecessary that the error correction for M bits is executed in the error location calculating process in the first stage, so that the number of bits N that can be corrected by the error location calculating unit 223 in the first stage may be set as N=M−1.

Figure 10:
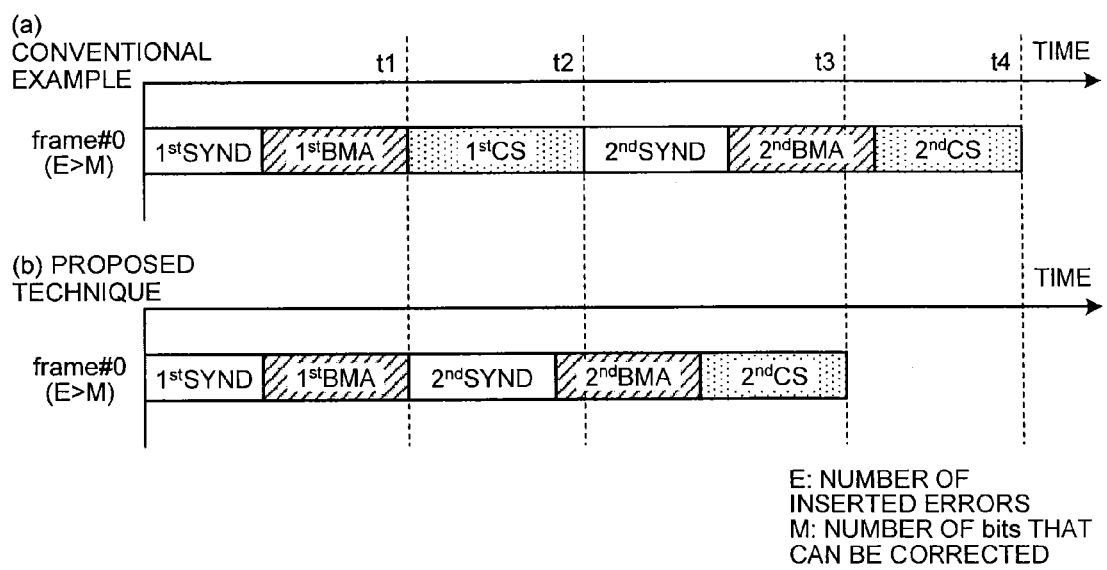
FIG. 10 is a view for describing an effect of the second embodiment.

FIG. 10 is a view for describing an effect of the present embodiment. FIG. 10A that is an upper chart illustrates the example of the conventional operation sequence, and FIG. 10B that is a lower chart illustrates the example of the operation according to the present embodiment. The abbreviations in the respective process are the same as those in FIG. 7. 1$^{st}$ means the process in the first stage, while 2$^{nd}$ means the process in the second stage. As illustrated in FIG. 10, in the present embodiment, the error correction process in the second stage can be started without executing the error location calculating process in the first stage, in a case of E>M.

In the present embodiment, as for the error correction in a case where the received code includes errors of M bits, the process in the second stage has to be executed, although the error correction is originally possible only in the first stage in the conventional case. However, when there are errors more than M bits, the error correction in the second stage can promptly be executed without a need to wait for the completion of the error location calculating process in the first stage, whereby the increase in the processing speed and the reduction in the power consumption can be realized as a whole without causing deterioration in the correcting capability.

Third Embodiment

Figure 11:
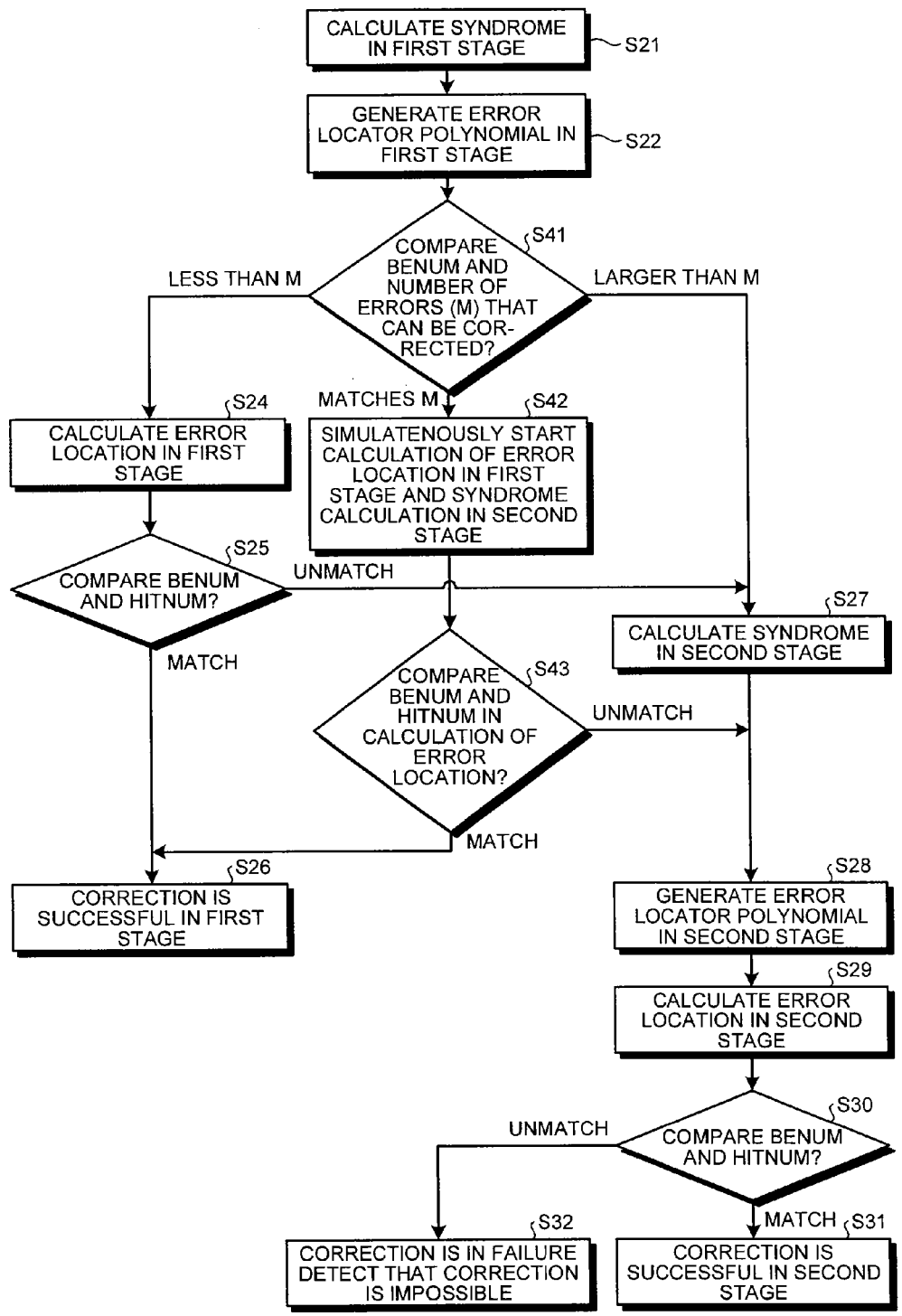
FIG. 11 is a flowchart illustrating one example of an error correction process in a semiconductor storage device according to a third embodiment.

FIG. 11 is a flowchart illustrating one example of an error correction process in a semiconductor storage device according to a third embodiment. The configuration of the semiconductor storage device in the present embodiment is the same as that of the semiconductor storage device in the second embodiment.

In the present embodiment, it is supposed that the multi-stages error correction coding process is executed as in the second embodiment. It is supposed that the number of bits that can be corrected in the error correction process in the first stage is defined as M bits, and the number of bits that can be corrected in the error correction process in the second stage is defined as L bits. In this case, when the number of error bits calculated in the error locator polynomial generating process in the first stage is M bits or more in the multi-stages error correction process according to the second embodiment, the process in the second stage is to be executed without the execution of the error location calculating process. On the other hand, in the present embodiment, when the number of error bits calculated by the error locator polynomial generating process in the first stage is M bits, the error correction process in the first stage and the error correction process in the second stage are executed in parallel in order to make the most of the correcting capability in the first stage.

When the number of error bits BENUM calculated in the error locator polynomial generating process in the first stage becomes M bits, it cannot be determined whether the received code includes errors of M bits or errors more than M bits. In the present embodiment, when the BENUM becomes M bits, the process in the second stage is speculatively started. In addition, the error location calculating process in the first stage is also executed.

As illustrated in FIG. 11, processes in step S21 and step S22 are executed as in the example in FIG. 8 according to the second embodiment. Then, the decoding control unit 225 compares the number of error bits BENUM calculated in the error locator polynomial generating process in the first stage and the number of error bits M that can be corrected in the first stage (step S41). When the BENUM is less than M (less than M in step S41), the processes in steps S25 and S26 are executed as in the example in FIG. 8 according to the second embodiment.

When the BENUM is larger than M (larger than M in step S41), the processes in steps S27 to S32 are executed as in the example in FIG. 8 according to the second embodiment.

When the BENUM matches M (match M in step S41), the decoding control unit 225 instructs to start both the error location calculating process in the first stage and the syndrome calculation in the second stage (step S42). With this process, the error location calculating unit 223 in the first stage executes the error location calculating process, and the syndrome calculating unit 221 in the second stage executes the syndrome calculation.

After the completion of the error location calculating process in the first stage, the decoding control unit 225 compares the BENUM and the HITNUM (the number of error bits detected by the error location calculating process) in the first stage (step S43), and when they match (match in step S43), it proceeds to step S26. In this case, the calculation result of the syndrome calculation in the second stage that is simultaneously executed is discarded.

When the BENUM and the HITNUM in the first stage do not match (unmatch in step S43), the decoding control unit 225 proceeds to step S28 where the processes after the error locator polynomial generating process in the second stage are executed.

In the example in FIG. 11, the error locator polynomial generating process in the second stage is executed after the determination in step S43. However, when the syndrome calculation in the second stage is ended before the error location calculating process in the first stage is ended, the error locator polynomial generating process in the second stage may be executed without waiting for the determination in step S43. In this case, when it is determined that the error correction in the first stage is successful in step S43, the process in the second stage is stopped, and the calculation result in the second stage up to that point is discarded. When it is determined that the error correction in the first stage is in failure, the process in the second stage is continued.

Figure 12:
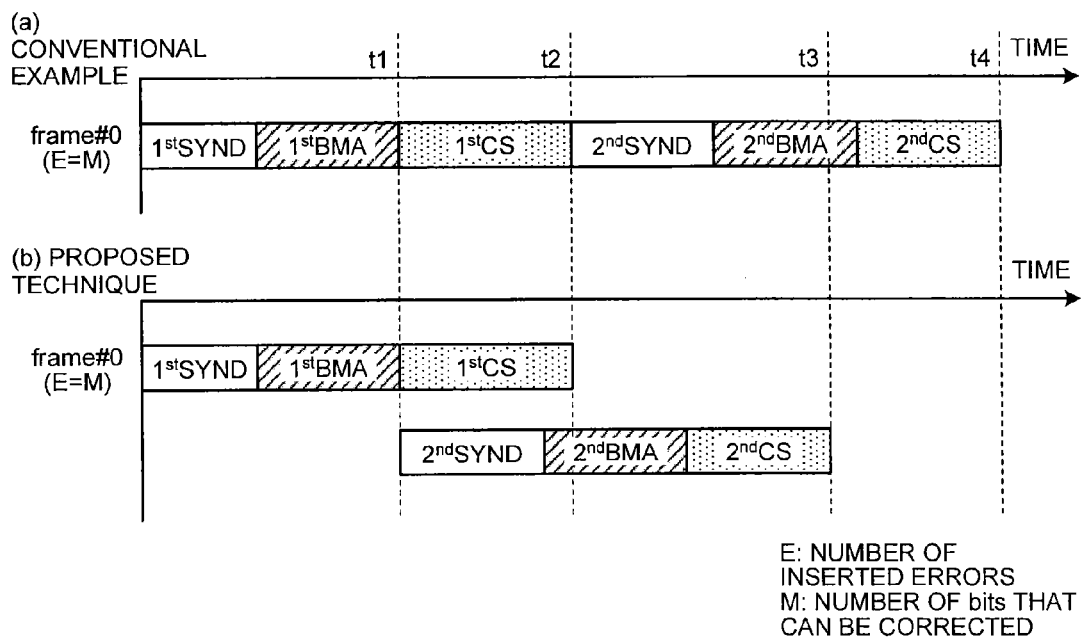
FIG. 12 is a view for describing an effect of the third embodiment.

FIG. 12 is a view for describing an effect of the present embodiment. FIG. 12A that is an upper chart illustrates the example of the conventional operation sequence, and FIG. 12B that is a lower chart illustrates the example of the operation according to the present embodiment. The abbreviations in the respective process are the same as those in FIG. 7. $1^{st}$ means the process in the first stage, while $2^{nd}$ means the process in the second stage. As illustrated in FIG. 12, in the present embodiment, the error location calculating process in the first stage and the error correction process in the second stage can simultaneously be started, in a case of E=M. In the second embodiment, the error correction circuit can be shared in the first stage and in the second stage. However, in the present embodiment, it is assumed that the error correction circuit is independently provided for the first stage and for the second stage.

As described above, when the BENUM is the same as M, the error location calculating process in the first stage is executed, and simultaneously, the error correction process in the second stage is started in the present embodiment. When the error correction in the first stage is successful (BENUM matches HITNUM), the result of the calculation in the second stage that is speculatively executed is discarded, and the result of the error correction by the error location calculating process in the first stage is employed. When the BENUM does not match the HITNUM in the first stage, the error correction process in the second stage that is speculatively executed is continued. Therefore, the increase in the processing speed and the reduction in the power consumption can be realized, while making the most of the correcting capability only in the first stage.

Fourth Embodiment

Figure 13:
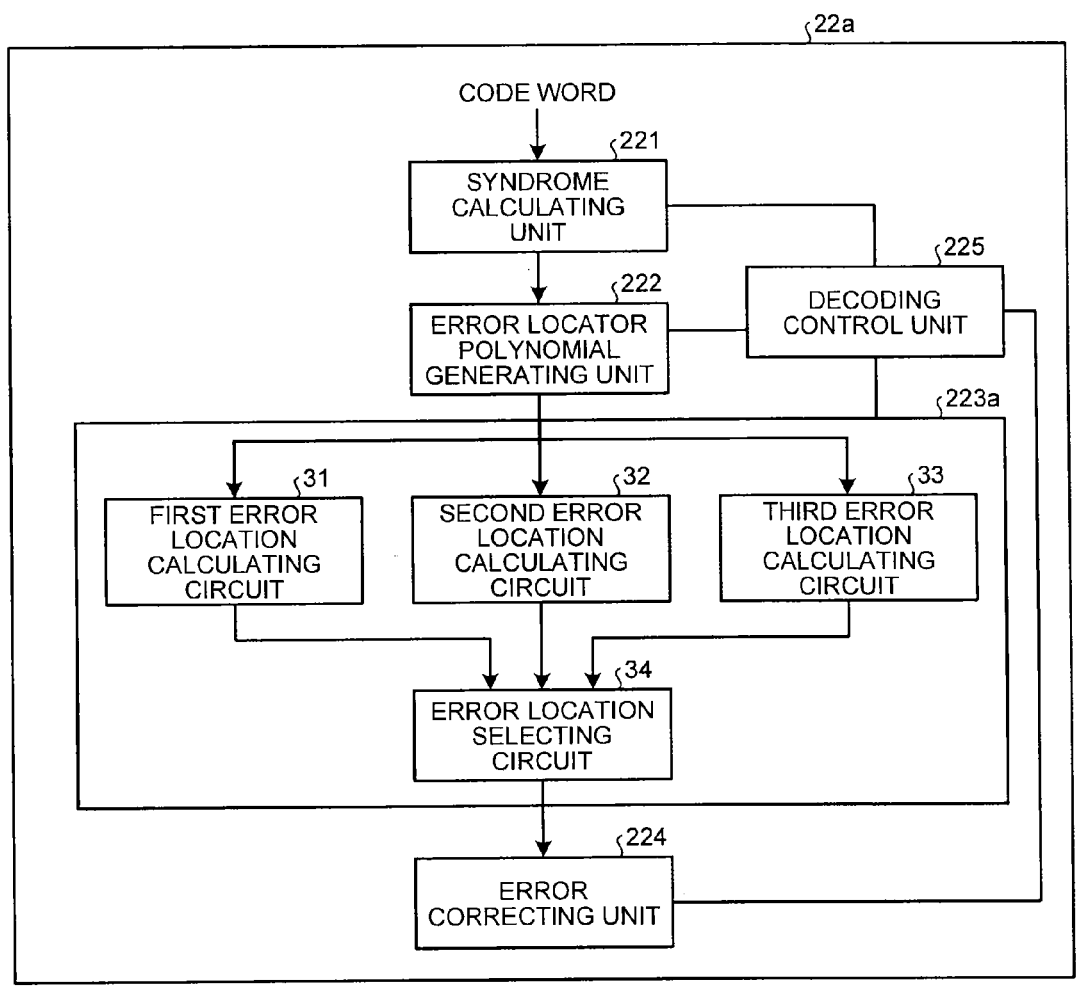
FIG. 13 is a diagram illustrating an example of a configuration of a decoder according to a fourth embodiment.

FIG. 13 is a view illustrating an example of a configuration of a decoder 22a in a semiconductor storage device according to a fourth embodiment. The semiconductor storage device according to the present embodiment is the same as the semiconductor storage device in the first embodiment, except that the decoder 22 is replaced by the decoder 22a. As illustrated in FIG. 13, the decoder 22a in the present embodiment is the same as the decoder 22 in the first embodiment, except that the error location calculating unit 223 in the first embodiment is replaced by an error location calculating unit 223a.

The scale of the error correction circuit executing the error correction increases roughly in proportion to the number of error bits that can be detected. When the circuit scale increases, dynamic power and leak power also increase. Therefore, it is desirable that the error location calculating circuit is operated with a smaller circuit scale, when there are a few errors. However, the error correction circuit is generally designed to correct errors in a predetermined number. When data including errors less than the predetermined number is inputted, the number of processing cycles is reduced, but during when the error correction circuit is operated, a circuit for correcting the highest number of errors that the circuit supports might be operated. Therefore, for a few errors that are inputted, consumed electricity is wasted. In particular, the number of errors of the NAND memory is not always constant. Therefore, a few errors are only generated just after a first use of a product, but errors increase with continuous use. Accordingly, at the time of starting the product, the number of errors is less than the predetermined number in most cases.

On the other hand, as described in the first embodiment, the number of error bits can be acquired at the time when the error locator polynomial generating process is ended. Therefore, in the subsequent process, the number of error locations can be calculated with the lowest power by calculation with the circuit that is optimized for the number of errors. Among the syndrome calculating unit 221, the error locator polynomial generating unit 222, and the error location calculating unit 223 illustrated in FIG. 2, the error location calculating unit 223 occupies almost a half of the whole error correction process from the viewpoint of circuit scale and power consumption. Therefore, it is desirable that a small circuit is used to execute the error location calculating process for a few errors. Accordingly, in the present embodiment, plural circuits, each being capable of detecting a different number of error locations, are provided, and each circuit is used according to the number of error bits calculated in the error locator polynomial generating process.

For example, in the example in FIG. 13, the error location calculating unit 223a includes a first error location calculating circuit 31, a second error location calculating circuit 32, a third error location calculating circuit 33, and an error location selecting circuit 34. In this embodiment, the number of bits that can be corrected by the decoder 22a is defined as 40 bits, wherein the first error location calculating circuit 31 can correct errors of 10 bits, the second error location calculating circuit 32 can correct errors of 20 bits, and the third error location calculating circuit 33 can correct errors of 40 bits. The error location selecting circuit 34 selects any one of the outputs from the first error location calculating circuit 31, the second error location calculating circuit 32, and the third error location calculating circuit 33, and outputs the selected one as the error location. FIG. 13 illustrates an example of including three circuits, each being capable of detecting a different number of error locations. However, the number of the circuits is not limited thereto, and plural circuits are only necessary. The number of bits that can be corrected by the decoder 22a, and the combination of the number of bits that can be corrected by the respective error location calculating circuits are not limited to the example illustrated in FIG. 13.

Figure 14:
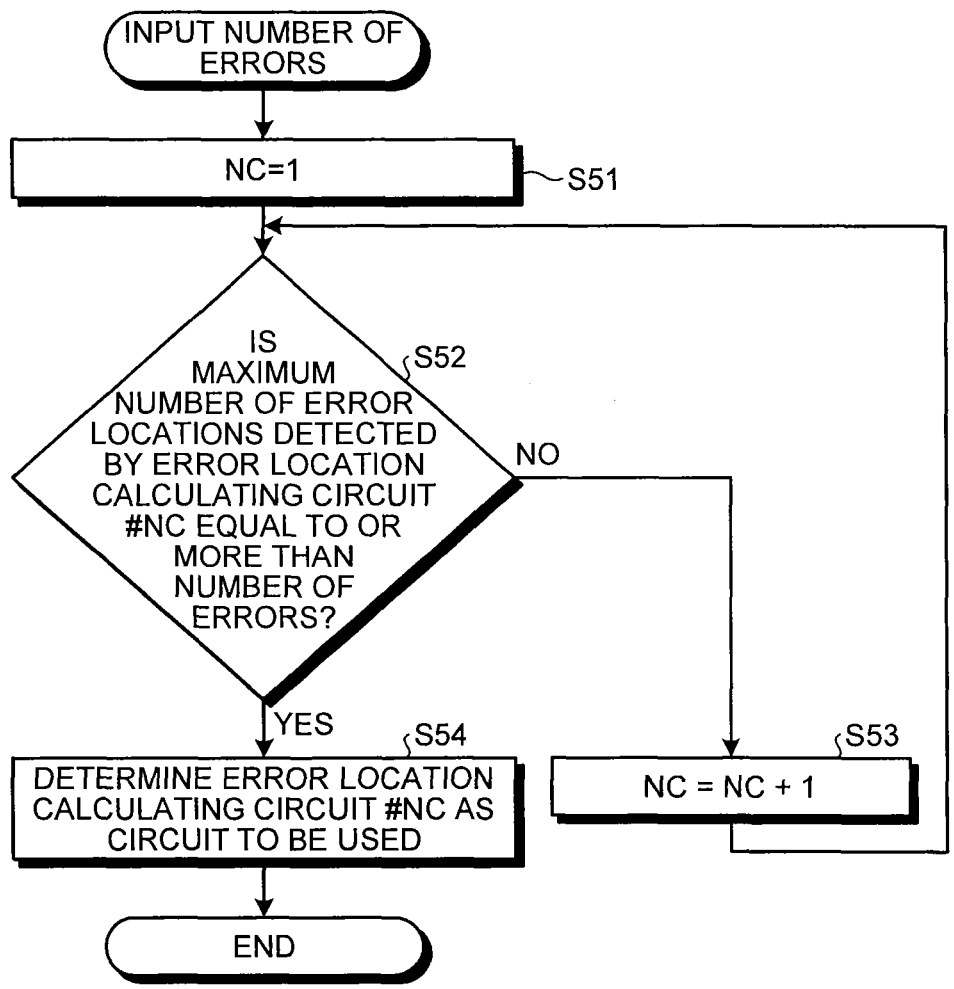
FIG. 14 is a flowchart illustrating one example of a selecting process of an error location calculating circuit according to the fourth embodiment.

FIG. 14 is a flowchart illustrating one example of the selecting process of the error location calculating circuit according to the present embodiment. The decoding control unit 225 sets a variable NC indicating a number that identifies the error location calculating circuit as NC=1 (step S51). It is supposed here that the first error location calculating circuit 31 corresponds to NC=1, the second error location calculating circuit 32 corresponds to NC=2, and the third error location calculating circuit 33 corresponds to N=3. The error location calculating circuit #i (i=1, 2, 3) indicates the i-th error location calculating circuit.

The decoding control unit 225 determines whether or not the highest number of the error locations detected by the error location calculating circuit #NC (the highest number of the error locations that can be detected by the error location calculating circuit #NC) is equal to or more than the number of error bits calculated in the error locator polynomial generating process (step S52). When the highest number of the error locations detected by the error location calculating circuit #NC is equal to or more than the number of error bits calculated in the error locator polynomial generating process (Yes in step S52), the decoding control unit 225 determines that the error location calculating circuit #NC is used, instructs the error location selecting circuit 34 to select the output from the error location calculating circuit #NC (step S54), and then, ends the selecting process of the error location calculating circuit.

When the highest number of the error locations detected by the error location calculating circuit #NC is less than the number of error bits calculated in the error locator polynomial generating process (No in step S52), the decoding control unit 225 sets as NC=NC+1 (step S53), and then, returns to step S52.

According to the procedure described above, the error location calculating circuit that can perform the process corresponding to the number of bits calculated by the error locator polynomial generating process and that can detect the smallest maximum number of error locations is selected. For example, the error locator polynomial generating unit 222 outputs that there are errors of 18 bits, the second error location calculating circuit 32 is selected.

The flowchart in FIG. 14 does not describe a case in which the inputted errors exceed the number of error locations that can be detected by any one of the mounted error location calculating circuits. However, when errors more than the number of errors that can be detected are included, the maximum number of errors is outputted in most cases in the error locator polynomial generating process, so that such description is unnecessary. For example, even if data including errors of 50 bits is inputted, the number of errors is outputted as 40 bits in the error locator polynomial generating process in most cases. However, there may be rare occasions that the number of errors outputted in the error locator polynomial generating process is larger than 40 bits. In consideration of this case, it is determined that the correction is impossible since the number of errors exceeds the number of bits that can be corrected, and the calculation of the error location is not executed, before the start of the flowchart in FIG. 14, when the number of errors outputted in the error locator polynomial generating process is larger than 40 bits.

Figure 15:
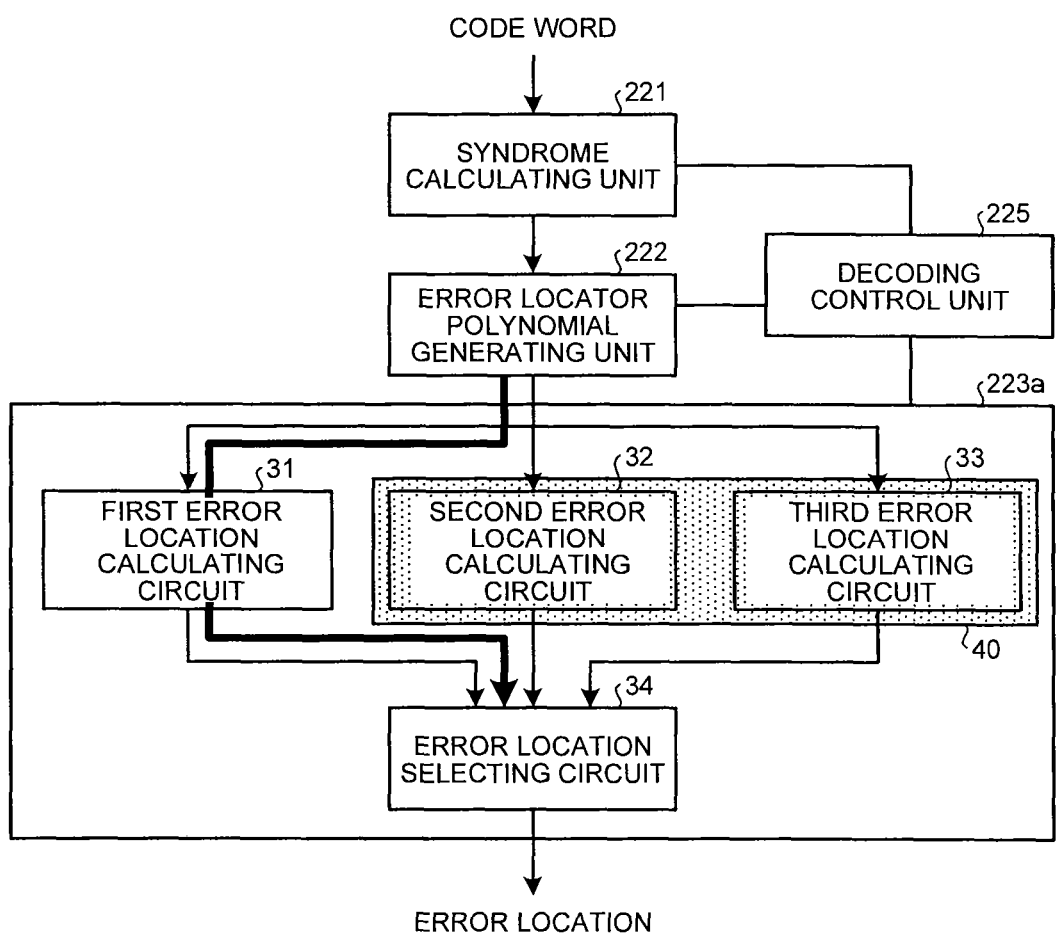
FIGS. 15, 16, and 17 are views illustrating the use state of the error location calculating circuit according to the fourth embodiment.
Figure 16:
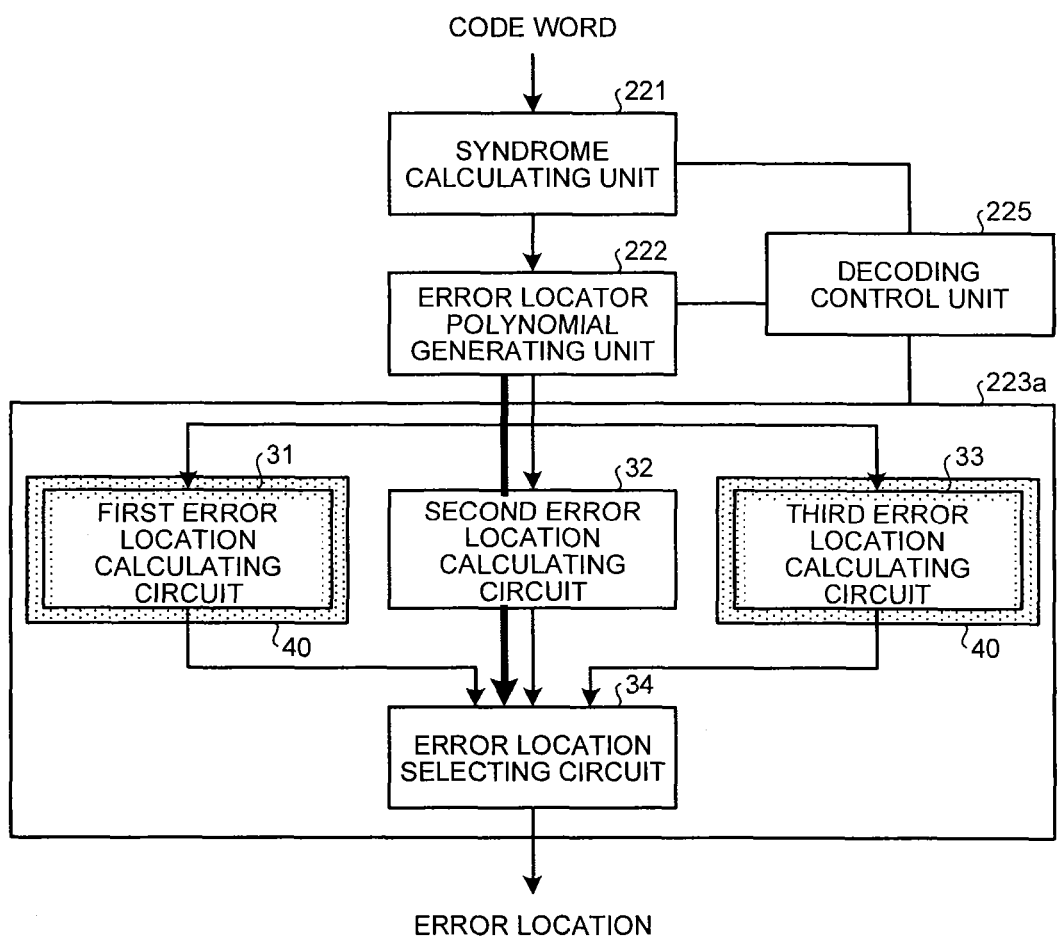
Figure 17:
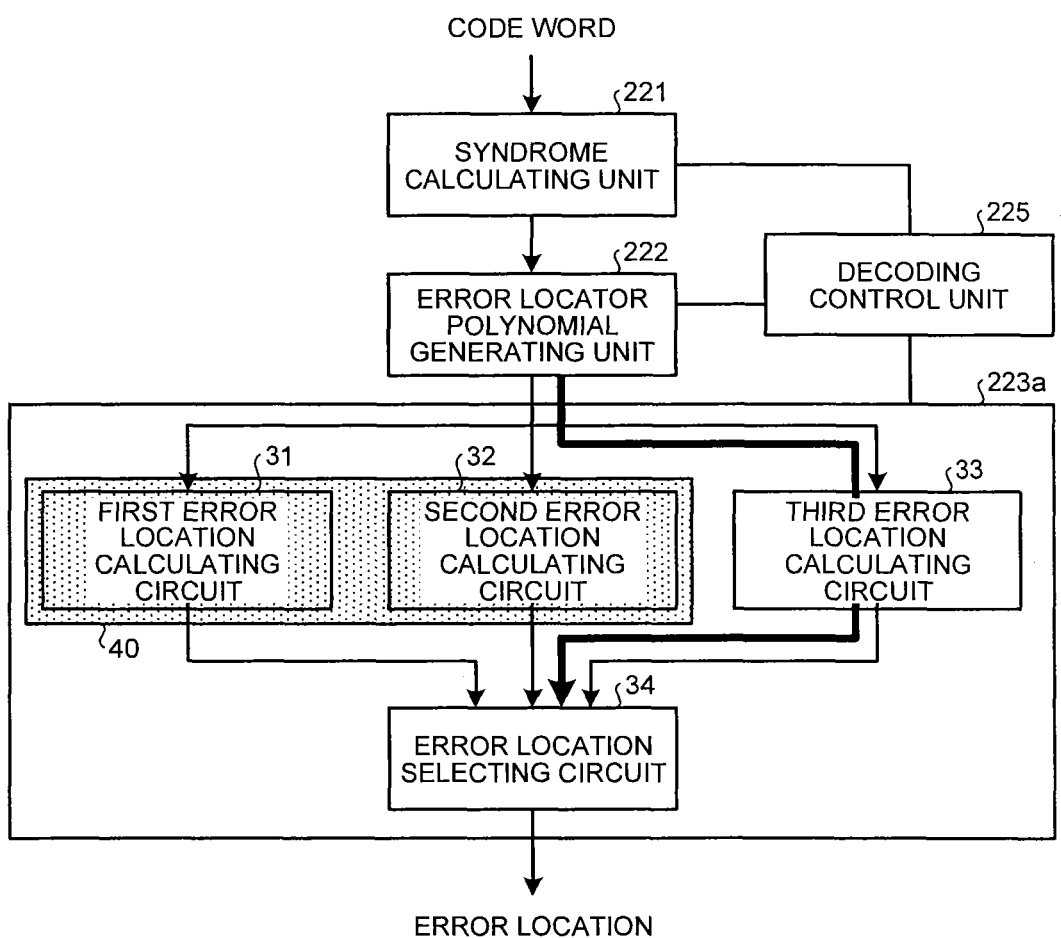

FIGS. 15, 16, and 17 are views illustrating the use state of the respective error location calculating circuits, when the number of errors (the number of error bits outputted from the error locator polynomial generating unit 222) is not more than 10 bits, 11 bits or more and 20 bits or less, and 21 bits or more. As illustrated in FIG. 15, when the number of errors is 10 bits or less, the first error location calculating circuit 31 is used. When the number of errors is 11 bits or more and 20 bits or less, the second error location calculating circuit 32 is used as illustrated in FIG. 16. When the number of errors is 21 bits or more, the third error location calculating circuit 33 is used as illustrated in FIG. 17. The smaller the number of the error locations that can be detected is, the more the power consumption of the error location calculating circuit reduces. Therefore, the most effective power saving effect according to the present embodiment is realized when the number of errors is 10 bits or less as illustrated in FIG. 15.

The circuit scale of the error location calculating circuit is large, and the leak power assumes a significant value. Therefore, if the power source of the error location calculating circuit that is not used is shut down as indicated by a hatching in FIGS. 15, 16, and 17 as a power shutdown 40, the power consumption can more be reduced.

Figure 18:
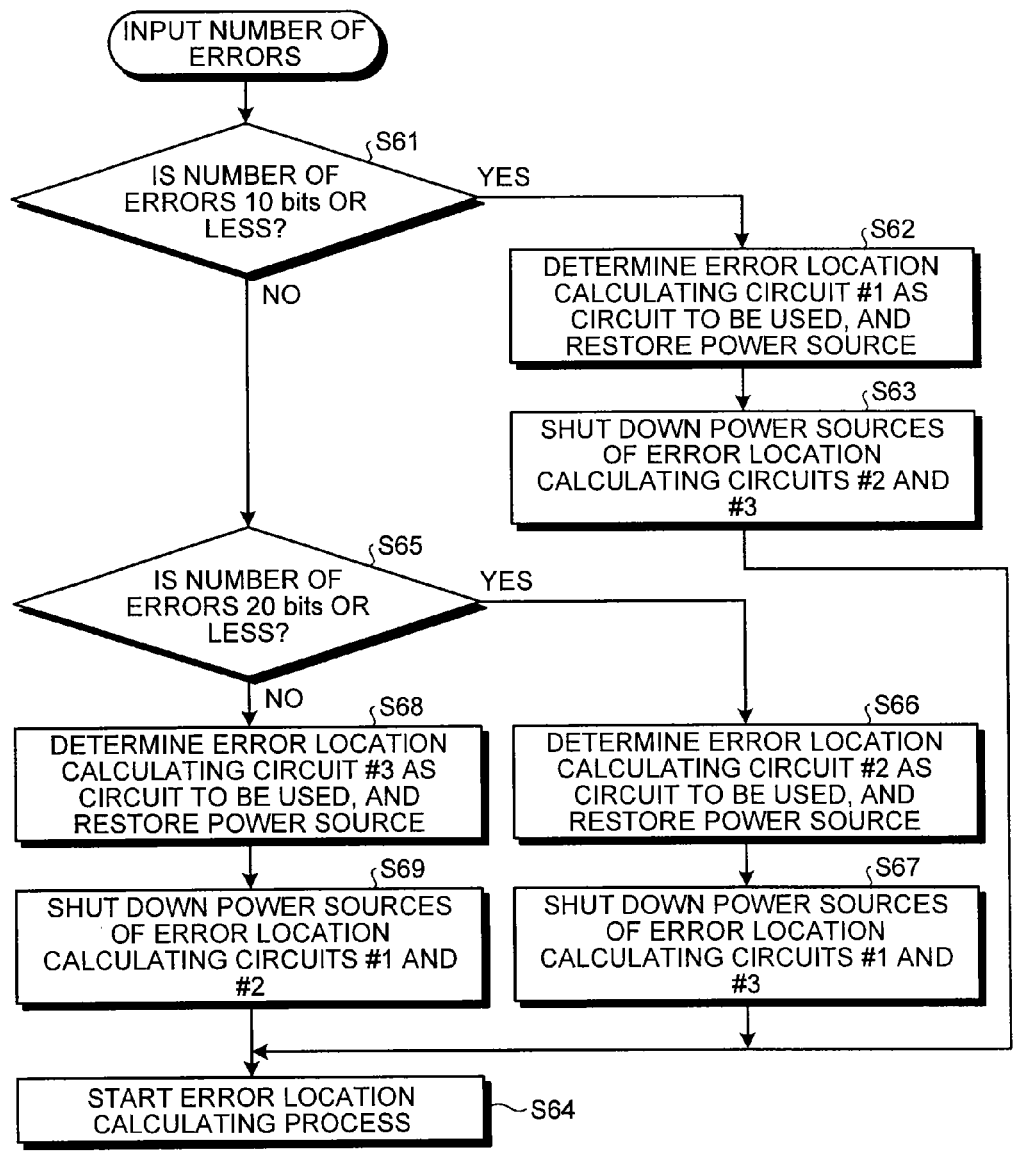
FIG. 18 is a flowchart illustrating one example of a selecting process of the error location calculating circuit, when a power source of an error location calculating circuit that is not used is shut down.

FIG. 18 is a flowchart illustrating one example of a selecting process of the error location calculating circuit when the power source of the error location calculating circuit that is not used is shut down. The decoding control unit 225 determines whether or not the number of error bits calculated in the error locator polynomial generating process is not more than 10 bits (step S61). When the number of error bits is 10 bits or less (Yes in step S61), the decoding control unit 225 determines that the first error location calculating circuit 31 (error location calculating circuit #1) is used, and the power source of the first error location calculating circuit 31 is restored. When the power source of the first error location calculating circuit 31 is not shut down, the supply of the power source is continued (step S62). The decoding control unit 225 shuts down the power sources of the second error location calculating circuit 32 (error location calculating circuit #2) and the third error location calculating circuit 33 (error location calculating circuit #3) (step S63), and then, starts the error location calculating process (step S64).

When the number of error bits is larger than 10 bits (No in step S61), the decoding control unit 225 determines whether or not the number of error bits is not more than 20 bits (step S65). When the number of error bits is 20 bits or less (Yes in step S65), the decoding control unit 225 determines that the second error location calculating circuit 32 (error location calculating circuit #2) is used, and the power source of the second error location calculating circuit 32 is restored. When the power source of the second error location calculating circuit 32 is not shut down, the supply of the power source is continued (step S66). The decoding control unit 225 shuts down the power sources of the first error location calculating circuit 31 (error location calculating circuit #1) and the third error location calculating circuit 33 (error location calculating circuit #3) (step S67), and then, starts the error location calculating process (step S64).

When the number of error bits is larger than 20 bits (step S65 No), the decoding control unit 225 determines that the third error location calculating circuit 33 (error location calculating circuit #3) is used, and the power source of the third error location calculating circuit 33 is restored. When the power source of the third error location calculating circuit 33 is not shut down, the supply of the power source is continued (step S68). The decoding control unit 225 shuts down the power sources of the first error location calculating circuit 31 (error location calculating circuit #1) and the second error location calculating circuit 32 (error location calculating circuit #2) (step S69), and then, starts the error location calculating process (step S64).

As described above, in the present embodiment, plural circuits, each being capable of detecting a different number of error locations, are prepared, and the error location calculating circuit to be used is selected according to the number of errors outputted from the error locator polynomial generating unit 222. Accordingly, the circuit that can correct errors with lower power consumption than the power consumption in the ordinary system can be provided, as the number of errors is smaller. The power source of the error location calculating circuit that is not used is shut down, whereby the power consumption can be further reduced.

Fifth Embodiment

FIG. 19 is a view illustrating an example of an operation of a semiconductor storage device according to a fifth embodiment. The configuration of the semiconductor storage device according to the present embodiment is the same as that of the semiconductor storage device according to the fourth embodiment. In the fourth embodiment, the power source of the error location calculating circuit that is not used is shut down to reduce power consumption. On the other hand, in the present embodiment, the error location calculating circuit that is not used is effectively utilized for the process of subsequent data.

As in the fourth embodiment, the semiconductor storage device according to the present embodiment includes the first error location calculating circuit 31, the second error location calculating circuit 32, and the third error location calculating circuit 33, and one of the circuits is selected according to the number of errors. The selecting process is the same as that in the fourth embodiment described with reference to FIG. 14.

In the present embodiment, when the data of the subsequent frame can be processed by the error location calculating circuit other than the error location calculating circuit that is currently used after the circuit to be used is selected, the process of the data of the subsequent frame is also started. Thus, the waiting time of the data of the subsequent data can be reduced, whereby the processing capability is expected to be enhanced.

FIG. 19 illustrates an example of a process in a pipeline manner, wherein an upper chart illustrates an example of the conventional operation, a middle chart illustrates an example of the operation according to the fourth embodiment, and a lower chart illustrates an example of the operation according to the fifth embodiment. The abbreviations in each process are the same as those in FIG. 7. CS#1 indicates an error location calculating process using the first error location calculating circuit 31, CS#2 indicates an error location calculating process using the second error location calculating circuit 32, and CS#3 indicates an error location calculating process using the third error location calculating circuit 33.

In the fourth embodiment, even if the pipeline process is executed, during the error location calculating process for the frame #0, the error location calculating process for the data of the subsequent frame #1 cannot be started until the error location calculating process for the frame #0 is completed.

On the other hand, in the present embodiment, when the error locator polynomial generating process for the frame #1 is ended before the error location calculating process for the frame #0 is ended, the error location calculating process for the frame #1 is executed by using the second error location calculating circuit 32, according to the pipeline process. The number of errors of the frame #2 is 21 to 40 bits, and the number of errors of the frame #3 is 1 to 10 bits. Therefore, when the error locator polynomial generating process for the frame #3 is ended before the error location calculating process using the third error location calculating circuit 33 for the frame #2 is ended, the error location calculating process for the frame #3 is executed by using the first error location calculating circuit 31.

As described above, when the error location calculating circuit that currently performs the error location calculating process and the error location calculating circuit used for the process of the data of the subsequent frame are different from each other, the process of the data of the subsequent frame can be executed simultaneously with the error location calculating process for the previous data.

Figure 20:
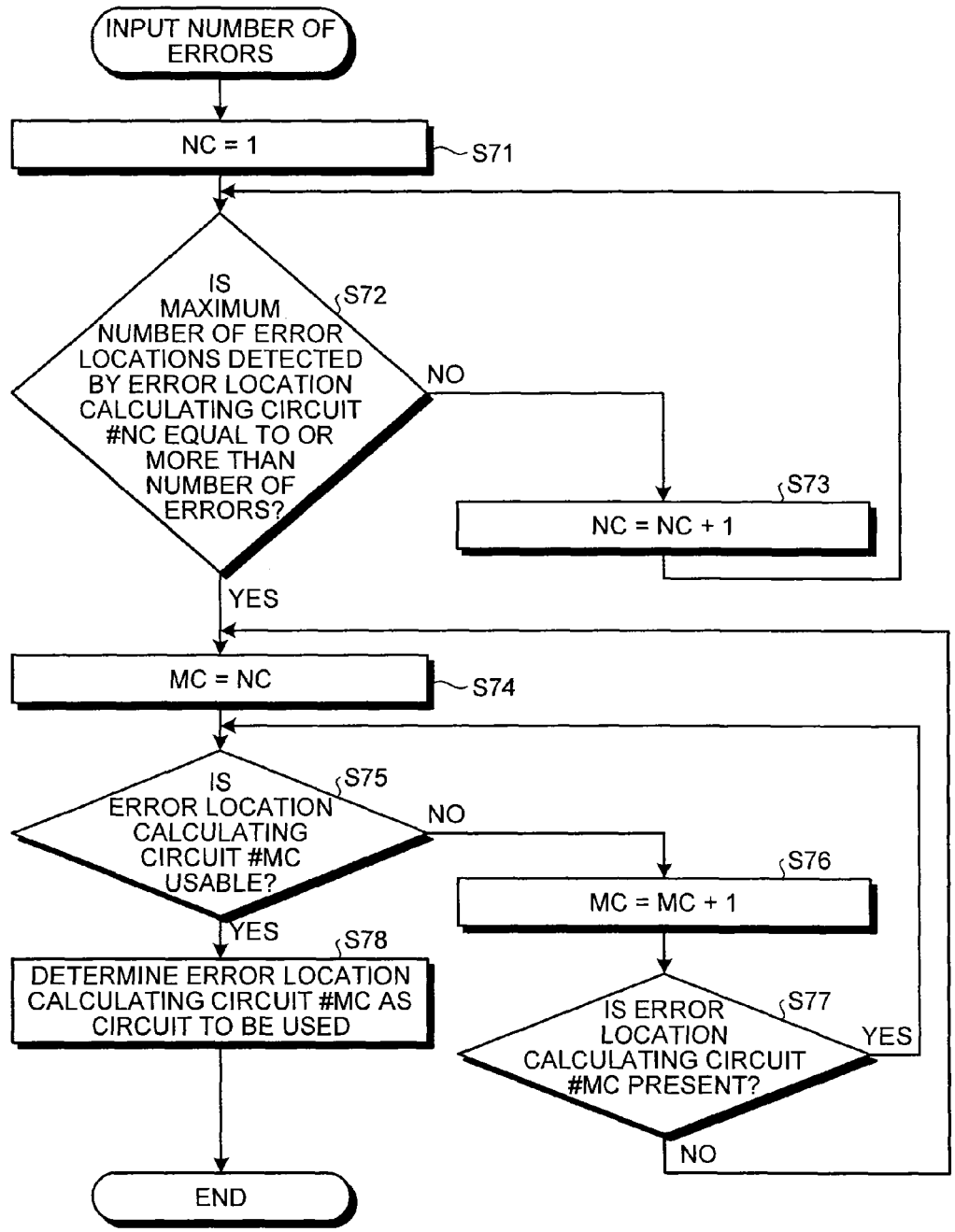
FIG. 20 is a flowchart illustrating one example of a selecting process of an error location calculating circuit according to the fifth embodiment.

FIG. 20 is a flowchart illustrating one example of the selecting process of the error location calculating circuit according to the present embodiment. The processes in steps S71 to S73 are the same as those in steps S51 to S53, so that the description will be omitted.

When the maximum number of the error locations to be detected by the error location calculating circuit #NC is equal to or more than the number of error bits calculated by the error locator polynomial generating process in step S72, a variable MC for identifying the error location calculating circuit to be used for the process is set as MC=NC (step S74). Then, the decoding control unit 225 determines whether the error location calculating circuit #MC can be used or not (whether it is currently used or not) (step S75), and when it can be used (Yes in step S75), the decoding control unit 225 determines that the error location calculating circuit #MC is to be used, instructs the error location selecting circuit 34 to select the output from the error location calculating circuit #MC (step S78), and then, ends the selecting process of the error location calculating circuit.

When determining that the error location calculating circuit #MC cannot be used in step S75 (No in step S75), the decoding control unit 225 sets as MC=MC+1 (step S76), and then, determines whether the error location calculating circuit #MC is present or not (step S77). When the error location calculating circuit #MC is present (Yes in step S77), it returns to step S75. When the error location calculating circuit #MC is not present (No in step S77), it returns to step S74.

According to the procedure described above, the error location calculating circuit that is not used is checked one by one from the error location calculating circuit that can detect the minimal number of the error locations, and when there is a free circuit, the process is started. When there is no free circuit among the error location calculating circuits that can perform the process corresponding to the number of errors, whether the error location calculating circuit that can perform the process corresponding to the smallest number of errors that can be corrected is used or not is again checked.

Figure 21:
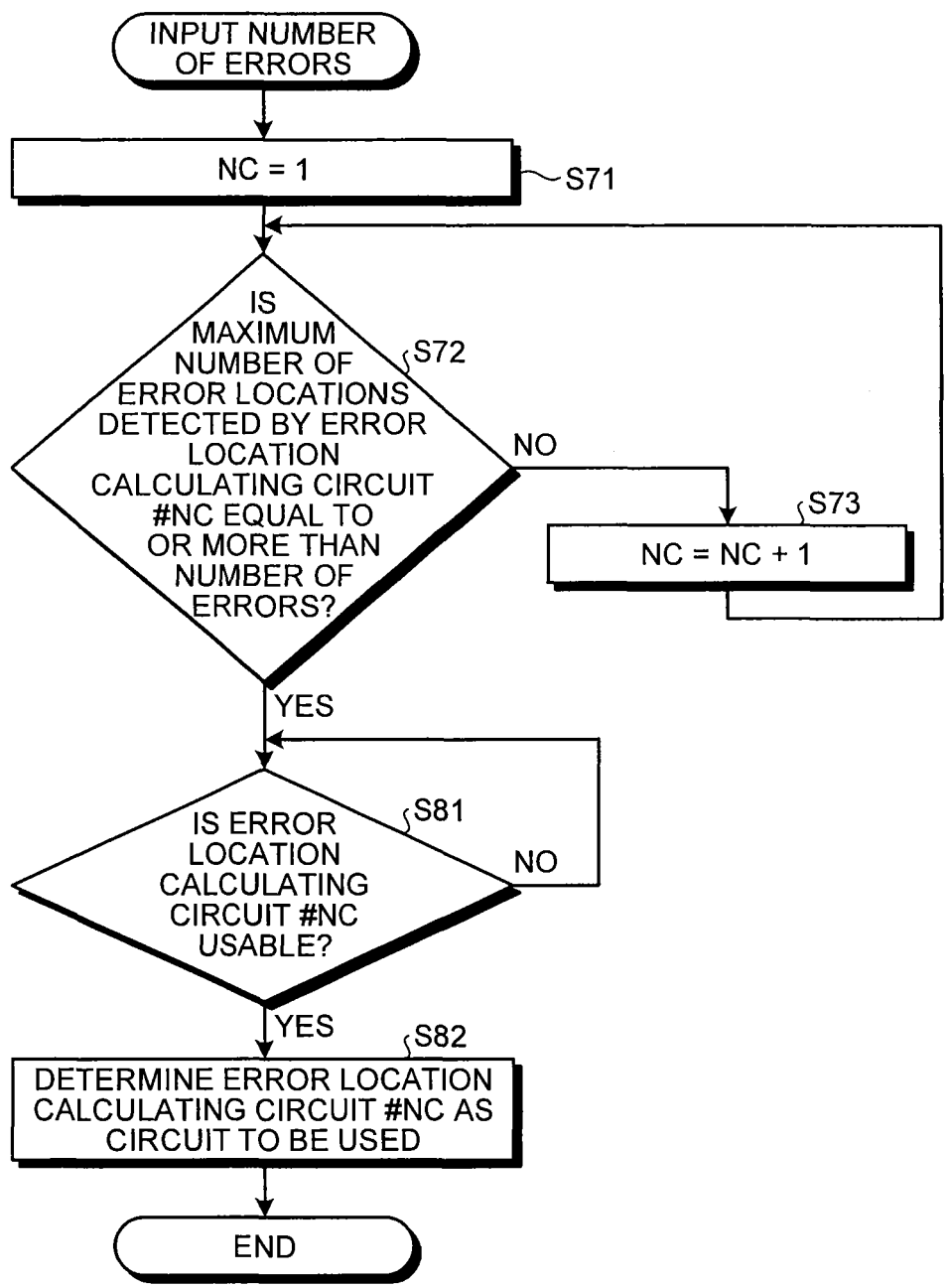
FIG. 21 is a flowchart illustrating another example of the selecting process of an error location calculating circuit according to the fifth embodiment.

In the flowchart in FIG. 20, there may be a case in which the error location calculating circuit that is larger than the smallest error location calculating circuit that can perform the process corresponding to the number of errors is used, which might increase power consumption. In order to prevent this situation, when the error location calculating circuit that is intended to be used has already been used in the first check, the device may wait until the use of this circuit is terminated. FIG. 21 illustrates the flowchart in this case. Steps S71 to S73 in FIG. 21 are the same as those in FIG. 20.

When the maximum number of the error locations detected by the error location calculating circuit #NC is equal to or more than the number of error bits calculated by the error locator polynomial generating process in step S72, the decoding control unit 225 determines whether the error location calculating circuit #NC can be used or not (step S81). When the error location calculating circuit #NC can be used (Yes in step S81), the decoding control unit 225 determines that the error location calculating circuit #NC is to be used, instructs the error location selecting circuit 34 to select the output from the error location calculating circuit #NC (step S82), and ends the selecting process of the error location calculating circuit. When the error location calculating circuit #NC cannot be used (No in step S81), the determination in step S81 is repeated until the error location calculating circuit #NC becomes usable.

As described above, in the present embodiment, plural circuits, each being capable of detecting a different number of error locations, are prepared, and the error location calculating circuit to be used is selected according to the number of errors outputted from the error locator polynomial generating unit 222. Further, the error location calculating process is executed simultaneously with the error location calculating process for the previous data by using the error location calculating circuit that is not used for the previous data. Accordingly, a high processing capability can be exhibited, while reducing the power consumption more than that in the ordinary system.

Sixth Embodiment

Figure 22:
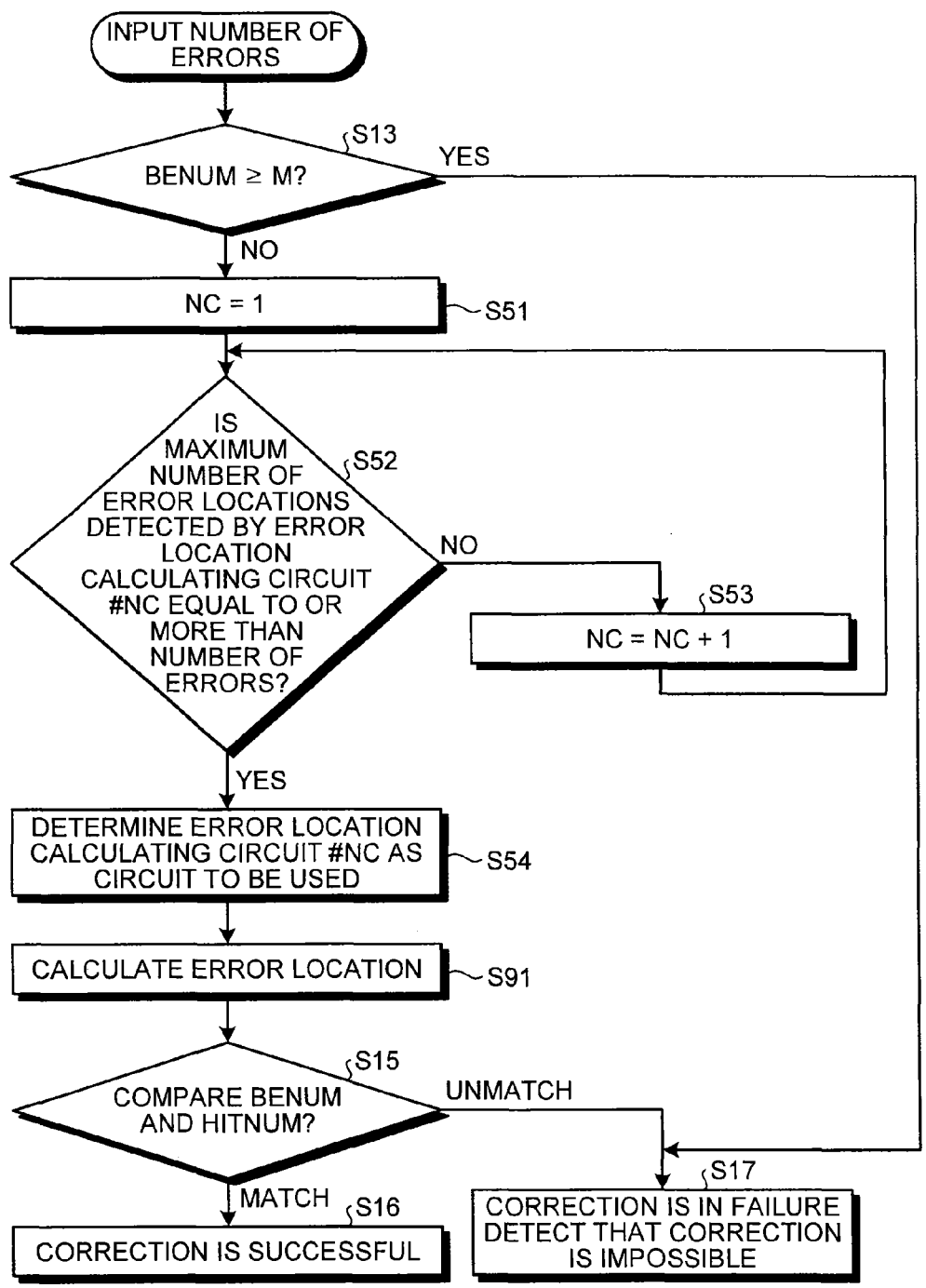
FIG. 22 is a view illustrating an example of an operation of an error correction process in a semiconductor storage device according to a sixth embodiment.

FIG. 22 is a view illustrating one example of an error correction process in a semiconductor storage device according to a sixth embodiment. The configuration of the semiconductor storage device according to the present embodiment is the same as that of the semiconductor storage device according to the fourth embodiment. The operation realized by combining the first embodiment and the fourth embodiment will be described in the present embodiment.

As in the first embodiment, the syndrome calculation and the error locator polynomial generating process are executed in steps S11 and S12. In FIG. 22, steps S11 and S12 are not illustrated. As in the first embodiment, the decoding control unit 225 determines whether or not the number of errors BENUM calculated by the error locator polynomial generating process is not less than M (step S13). M is the maximum number of bits that can be corrected in the error locator polynomial generating process.

When the BENUM is M or more (Yes in step S13), step S17 is executed as in the first embodiment. When the BENUM is less than M (No in step S13), the decoding control unit 225 executes steps S51 to S54 as in the fourth embodiment. When the error location calculating process by the error location calculating circuit selected in step S54 is ended (step S91), step S15 is executed as in the first embodiment. When the BENUM and the HITNUM match (match in step S15), the decoding control unit 225 proceeds to step S16, and when the BENUM and the HITNUM do not match (unmatch in step S15), it proceeds to step S17.

In the example in FIG. 22, the process of detecting the error location of M bits is unnecessary, so that the third error location calculating circuit may be a circuit that can perform a process corresponding to (M−1) bits.

As described in the fourth embodiment, the power source of the circuit that is not used may be shut down.

As described above, in the present embodiment, the operation realized by combining the first embodiment and the fourth embodiment is executed. Therefore, the power-saving effect can be enhanced more, compared to the first embodiment.

The example of combining the first embodiment and the fourth embodiment has been described above. However, the second embodiment and the fourth embodiment may similarly be combined. In this case, in step S41 in the flowchart in FIG. 11, the error location calculating circuit may be selected and executed by the selecting process of the error location calculating circuit according to the fourth embodiment in the calculation of the error location in the first stage in step S24 that is executed when the BENUM is less than M.

The first embodiment and the fifth embodiment may be combined. In this case, it is determined whether or not the number of errors is not less than M before step S71 in FIG. 20, and when it is M or more, it may be determined that the correction is impossible without executing the error location calculating process. When the number of errors is less than M, the processes in step S71 and the subsequent steps may be executed.

The second embodiment and the fifth embodiment may be combined. In this case, in step S41 in the flowchart in FIG. 11, the error location calculating circuit may be selected and executed by the selecting process of the error location calculating circuit according to the fifth embodiment in the calculation of the error location in the first stage in step S24 that is executed when the BENUM is less than M.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a memory, the memory controller comprising:
   an encoder that executes an error correction coding process based upon user data stored in the memory to generate a code word; and
   a decoder configured that executes an error correction process based upon the code word read from the memory, wherein the decoder includes:
   a syndrome calculating unit that calculates a syndrome based upon the code word read from the memory;
   an error locator polynomial generating unit that generates an error locator polynomial based upon the syndrome, and obtains a number of errors based upon the generated error locator polynomial;
   an error location calculating unit that calculates an error location based upon the error locator polynomial; and
   a decoding control unit that controls the error location calculating unit not to perform any calculation of the error location when the number of errors is not less than the maximum number of bits that are corrected by the error locator polynomial generating unit.

2. The memory controller according to claim 1, wherein the decoding control unit controls to execute the process of the error location calculating unit for the code word, when the number of errors is less than the maximum number.

3. The memory controller according to claim 1, wherein the number of bits that are corrected by the error location calculating unit is less than the number of bits that are corrected by the syndrome calculating unit and the error locator polynomial generating unit.

4. The memory controller according to claim 1, wherein the process of the syndrome calculating unit, the process of the error locator polynomial generating unit, and the process of the error location calculating unit are executed according to a pipeline processing system.

5. The memory controller according to claim 1, wherein
   the error correction coding process is a multi-stage error correction coding process,
   the decoder executes the error correction process in multiple stages, and
   when the number of errors calculated in the error correction process in a first stage is not less than the maximum number of bits that are corrected by the error locator polynomial generating unit executing the error correction process in the first stage, the decoding control unit controls to start the error correction process in a second stage, and not to execute the process of the error location calculating process in the first stage.

6. The memory controller according to claim 1, wherein
   the error correction coding process is a multi-stage error correction coding process,
   the decoder executes the error correction process in multiple stages, and executes the error correction process in a first stage by using the syndrome calculating unit, the error locator polynomial generating unit, and the error location calculating unit, and
   when the number of errors calculated in the error correction process is larger than the maximum number of bits that are corrected by the error locator polynomial generating unit executing the error correction process, the decoding control unit controls to start the error correction process in a second stage, and not to execute the process of the error location calculating process in the first stage, and when the number of errors is equal to the maximum number of bits that can be corrected by the error locator polynomial generating unit executing the error correction process, the decoding control unit controls to start the error correction process in the second stage, and to execute the process of the error location calculating process in the first stage.

7. The memory controller according to claim 1, wherein the error correction coding process is Bose-Chaudhuri-Hocquenghem coding process.

8. The memory controller according to claim 1, wherein the error correction coding process is Reed-Solomon coding process.

9. The memory controller according to claim 1, wherein
the error location calculating unit includes a plurality of error location calculating circuits, each detecting different number of bits, and each calculating an error location based upon the error locator polynomial, and
the decoding control unit selects the error location calculating circuit used according to the number of errors.

10. A memory controller that controls a memory, the memory controller comprising:
an encoder that executes an error correction coding process based upon user data stored in the memory to generate a code word; and
a decoder that executes an error correction process based upon the code word read from the memory, wherein the decoder includes:
  a syndrome calculating unit that calculates a syndrome based upon the code word read from the memory;
  an error locator polynomial generating unit that generates an error locator polynomial based upon the syndrome, and obtains a number of errors based upon the generated error locator polynomial;
  a plurality of error location calculating circuits, each detecting different number of bits, and each calculating an error location based upon the error locator polynomial; and
  a decoding control unit that selects one of the error location calculating circuits according to the number of errors.

11. The memory controller according to claim 10, wherein the decoding control unit selects, out of the error location calculating circuits that detect the number of errors, the error location calculating circuit that correct the minimum number of bits as the error location calculating circuit to be used.

12. The memory controller according to claim 10, wherein the power source of the error location calculating circuit that is not used is shut down.

13. The memory controller according to claim 10, wherein
the process of the syndrome calculating unit, the process of the error locator polynomial generating unit, and the process of the error location calculating unit are executed according to a pipeline processing system, and
when at least one of the error location calculating circuits is used, the error location calculating process to a code word different from the code word that is currently processed is executed by using the error location calculating circuit that is not used.

14. A semiconductor storage device comprising:
an encoder that executes an error correction coding process based upon user data stored in the memory to generate a code word;
a memory that stores the code word; and
a decoder that executes an error correction process based upon the code word read from the memory, wherein the decoder includes:
  a syndrome calculating unit that calculates a syndrome based upon the code word read from the memory;
  an error locator polynomial generating unit that generates an error locator polynomial based upon the syndrome, and obtains a number of errors based upon the generated error locator polynomial;
  an error location calculating unit that calculates an error location based upon the error locator polynomial; and
  a decoding control unit that control the error location calculating unit not to perform any calculation of the error location when the number of errors is not less than the maximum number of bits that can be are corrected by the error locator polynomial generating unit.

* * * * *